(12) United States Patent
Tokutome et al.

(10) Patent No.: US 6,480,439 B2
(45) Date of Patent: Nov. 12, 2002

(54) SEMICONDUCTOR DEVICE

(75) Inventors: Hiroto Tokutome, Tokyo (JP); Yutaka Ikeda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/828,945

(22) Filed: Apr. 10, 2001

(65) Prior Publication Data

US 2002/0039323 A1 Apr. 4, 2002

(30) Foreign Application Priority Data

Oct. 3, 2000 (JP) ........................................ 2000-303753

(51) Int. Cl.[7] ................................................ G11C 8/00
(52) U.S. Cl. ................................... 365/233; 365/230.08
(58) Field of Search ............................ 365/233, 189.05, 365/189.08, 189.12, 230.08

(56) References Cited

U.S. PATENT DOCUMENTS

| | | | |
|---|---|---|---|
| 5,337,285 A | | 8/1994 | Ware et al. .................. 365/227 |
| 6,011,732 A | * | 1/2000 | Harrison et al. ............. 365/191 |
| 6,023,442 A | * | 2/2000 | Hachiya .................. 365/189.05 |
| 6,147,927 A | * | 11/2000 | Ooishi .......................... 365/191 |
| RE37,273 E | * | 7/2001 | Shinozaki .................... 365/233 |
| 6,266,294 B1 | * | 7/2001 | Yada et al. .................. 327/198 |
| 6,269,048 B1 | * | 7/2001 | Kano et al. .................. 365/194 |
| 6,349,071 B1 | * | 2/2002 | Yoshimoto ................... 365/191 |

FOREIGN PATENT DOCUMENTS

| | | |
|---|---|---|
| JP | 61-18021 | 1/1986 |
| JP | 9-36733 | 2/1997 |

* cited by examiner

Primary Examiner—Richard Elms
Assistant Examiner—Hien Nguyen
(74) Attorney, Agent, or Firm—McDermott, Will & Emery

(57) ABSTRACT

Consuming current must be reduced in each operation state of a semiconductor device which operates in synchronized with an external clock signal. However, in each operation state, for satisfying the stability of an operation and a speedup, the suppression of consuming current has been performed under difficult circumstances. For solving this problem, a clock generation circuit generating an internal clock signal based on an external clock signal is activated during a specific time period when a clock synchronization circuit is in a state of inactivation.

21 Claims, 19 Drawing Sheets

SEMICONDUCTOR DEVICE

BACKGROUND OF THE INVENTION

1. Field of the Invention

The present invention generally relates to a semiconductor device, and in particular to a semiconductor device having a circuit construction operating on the basis of a clock signal applied from an external portion.

2. Description of the Prior Art

In accordance with the development of recent information devices, a semiconductor device has been also developed, as a prerequisite condition for satisfying portability particularly for a lap top computer, a portable terminal device and the like, an operation of a higher speed, with a lower consuming power and a lower voltage is required.

However, it is not easy to satisfy two prerequisite conditions of higher speedy operation and lower consuming power, and various developments of technologies have been performed.

Especially, in a dynamic random access memory (hereinafter, referred to as DRAM), a variety of technological developments have been performed, recently, and a synchronous DRAM (hereinafter, referred to as SDRAM) which is operable in synchronization with a high speed clock signal over 100 MHz of frequency from the external.

Moreover, conventionally SDRAM has performed inputting and outputting data corresponding to a rise of a clock signal, however, DDR (Double Data Rate) SDRAM performing the data input and output at both rise and fall timings of a clock signal has been also developed.

In order to realize a DDR SDRAM, it is necessary to suppress deviation of a timing is caused due to external factors such as temperature of a semiconductor device, variation of power voltage, process dispersion and the like.

Particularly, for an internal clock signal used inside of a semiconductor device in synchronized with the external clock signal, it is important to suppress an occurrence of a jitter and variation in frequency, and therefore a DLL (Delay Locked Loop) circuit is introduced.

A DLL circuit controls an amount of delay of an internal clock signal, so that a time difference with respect to the external clock signal can be made constant and data outputting can be performed both in a rise and a fall of a high speed clock signal.

Although a DDR SRAM has been exemplified as described above, in order to correspond to portable devices and the like despite of acceleration in technology, consuming current must be reduced in each operating state of semiconductor devices including not only SDRAM but also other devices operating in synchronized with an external clock signal.

However, in each operating state, under the present circumstances, it is difficult to suppress consuming current in consideration of satisfying stability and acceleration of an operation.

Moreover, particularly in a DDR SDRAM, although there are a plurality of operating states, recently, in a state of a power down mode where a command made by combination of control signals from the external is not inputted, the reduction of consuming current in the power down mode has been strongly required.

However, in order to stably hold data in a memory cell even in the power down mode, and in order to enable a higher operation even in the case where the power down mode is changed into the usual operation mode, a variety of circuits such as an internal step-down circuit, a substrate bias circuit, a word line boost circuit, a refresh circuit, a DLL circuit and the like are made be operated constantly.

Therefore, the suppression of consuming current in the power down mode has been difficult.

However, in consideration of adaptation to portable devices and the like, the suppression of consuming current in the power down mode has been an important task in DDR SDRAM and the like.

SUMMARY OF THE INVENTION

An essential object of the present invention is to solve the above described problem and to provide a semiconductor device capable of reducing consuming current while prerequisite conditions for such as stability of an operation and the like are satisfied in a specified operating condition.

Further, it is another object to provide a semiconductor device capable of reducing consuming current while the prerequisite conditions for such as the stability of an operation and the like are satisfied in the power down mode of DDR SDRAM and the like.

According to a first aspect of the present invention, a semiconductor device comprises: a clock generation unit generating an internal clock signal based on an external clock signal; a clock synchronization unit adapted to operate in synchronization with the internal clock signal; and a control unit adapted to activate the clock generation unit for a specific time period when the clock synchronization unit is in a state of inactivation.

According to a second aspect of the present invention, an input signal to the control unit is produced based on an external input signal and the control unit generates a control signal for controlling activation or inactivation of the clock generation unit in accordance with the input signal.

According to a third aspect of the present invention, when the clock synchronization unit is in a state of inactivation, the control signal for activating the clock generation unit is generated by the control unit based on the external input signal which is a pulse signal.

According to a fourth aspect of the present invention, the input signal to the control unit is a first pulse signal which is produced based on the external input pulse signal and the control unit generates a second pulse signal as the control signal for activation of the clock generation unit wherein the second pulse signal has its rise or fall delayed with respect to a rise or fall of the first pulse signal.

According to a fifth aspect of the present invention, a start of the second pulse signal is based on a change of the first pulse signal and an end of the second pulse signal is based on a fact that a third pulse signal which is generated in the control unit based on the first pulse signal reaches a specified number of pulses.

According to a sixth aspect of the present invention, a start of the second pulse signal is based on a fact that a third pulse signal which is generated in the control unit based on the first pulse signal reaches a first specified pulse number and an end of the second pulse signal is based on a fact that the third pulse signal reaches a second specified pulse number which is larger than the first specified pulse number.

According to a seventh aspect of the present invention, when the third pulse signal reaches a third pulse number which is larger than that the second pulse number, the pulse number of the third pulse signal is reset, and the pulse number of the third pulse signal is again increased to reach to the first and second pulse numbers, whereby the second pulse signal is periodically generated.

According to an eighth aspect of the present invention, the control unit includes a ring oscillator generating the third pulse signal and a counter counting a pulse number of the third pulse signal.

According to a ninth aspect of the present invention, the control unit includes a ring oscillator generating the third pulse signal, a counter counting a pulse number of the third pulse signal and a logic circuit outputting a designation signal designating a start of the second pulse signal when the counter reaches the first pulse number and outputting a designation signal designating an end of the second pulse signal when reaching the second pulse number.

According to a tenth aspect of the present invention, the control unit further receives another internal clock signal inputted thereto which is produced based on another external clock signal, and wherein a start of the second pulse signal is based on a change of the first pulse signal and an end of the second pulse signal is based on a fact that the another internal clock signal reaches a specified pulse number.

According to an eleventh aspect of the present invention, the control unit includes a counter counting a pulse number of the another internal clock signal.

According to a twelfth aspect of the present invention, the control unit includes a shift resistor which is controlled by another internal clock signal produced based on an external clock signal, and wherein a start of the second pulse signal is based on a change of the first pulse signal and an end of the second pulse signal is based on the first pulse signal which has passed through the shift resistor.

According to a thirteenth aspect of the present invention, the clock generation unit includes a delay locked loop circuit.

In this construction, the clock generation unit may make an input signal of the delay locked loop circuit a fixed signal before and after the clock generation unit is activated during the specific time period.

The semiconductor device may include a dynamic random access memory, and the clock synchronization unit includes an output circuit of read data of the dynamic random access memory.

In this construction, the input signal of the control unit produced based on the external input signal is a clock enable signal for designating an input of an external signal for controlling an operation of the dynamic random access memory.

An inactivated state of the output circuit of the read data may be a power down mode of the dynamic random access memory.

The specific time period for activating the clock generation unit may include an auto refresh time period of the dynamic random access memory.

The input signal of the control unit produced based on the external input signal may be an auto refresh designation signal.

The input signal of the control unit produced based on the external input signal may be a signal for activating a read operation.

The specific time period for activating the clock generation unit may be made less than one-tenth of a time period of a power down mode.

BRIEF DESCRIPTION OF THE DRAWINGS

These and other objects and features of the present invention will be readily understood from the following detailed description taken in conjunction with preferred embodiments thereof with reference to the accompanying drawings, in which like parts are designated by like reference numerals and in which.

DESCRIPTION OF THE PREFERRED EMBODIMENTS

Embodiment 1

Figure 1:
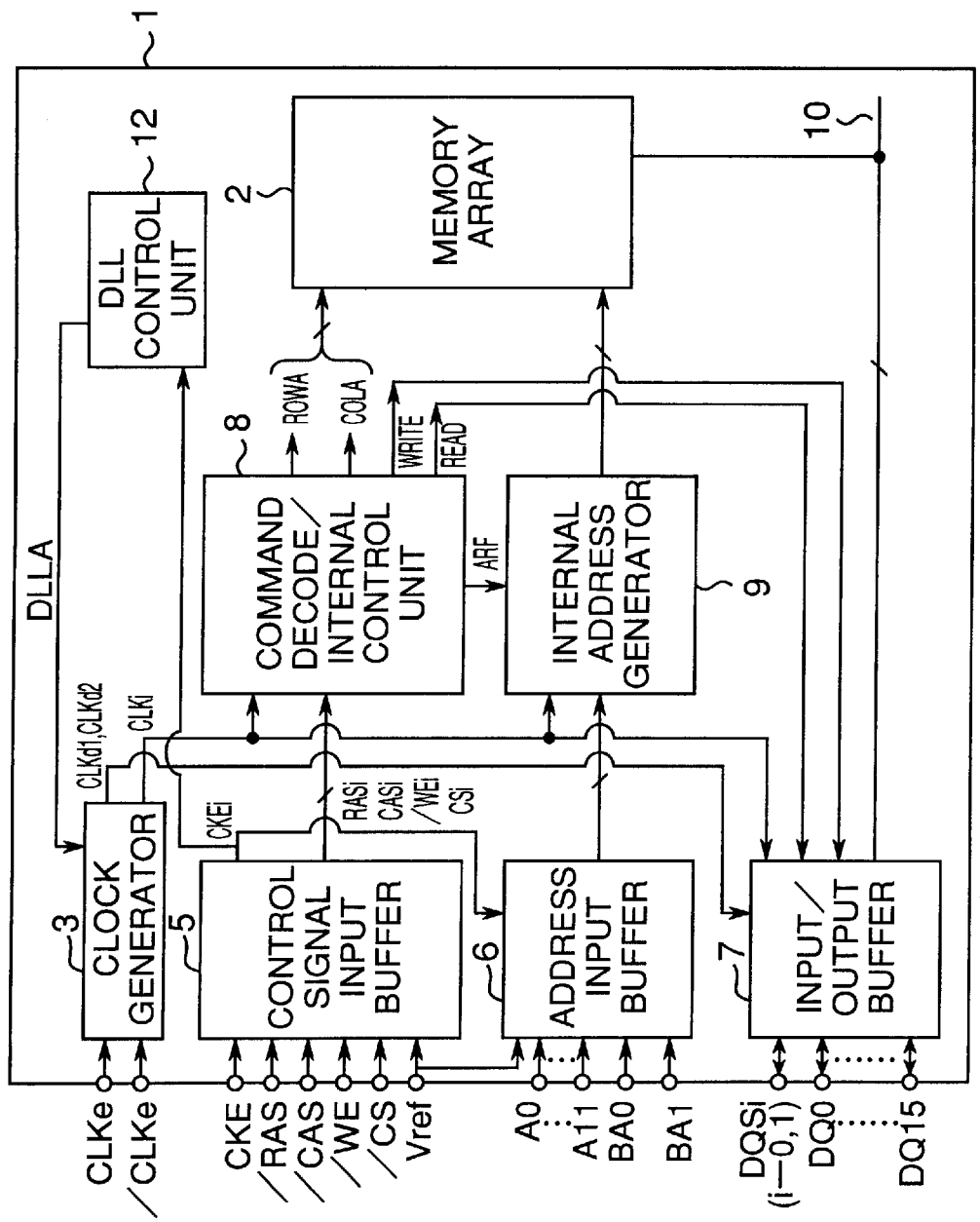
FIG. 1 is a schematic diagram showing the entire DDR SDRAM of the first embodiment of the present invention.

FIG. 1 is a schematic diagram showing an entire constitution of a 128 M bits DDR SDRAM of the first embodiment of the present invention.

In FIG. 1, reference numeral 1 denotes a DDR SDRAM semiconductor device. The DDR SDRAM 1 includes a memory array portion 2 having a plurality of banks whose one unit is comprised of a certain number of memory cells arranged in an array shape. The DDR SDRAM 1 further includes a clock generator 3 which receives complementary external clock signals CLKe and /CLKe from an external for determining an operational timing of the semiconductor device and which generates an internal clock signal CLKi for determining an operational timing inside the semiconductor device and which generates DLL output signals CLKd1 and CLKd2 each of which is an internal clock signal for controlling a timing of outputting data during a read operation of the DDR SDRAM 1.

Furthermore, the DDR SDRAM 1 includes a control signal input buffer 5 which receives a clock enable signal CKE for designating an input of a control signal to the DDR SDRAM, row address strobe signal /RAS which is one of the control signals, a column address strobe signal /CAS which is one of the control signals, a write enable signal /WE which is one of the control signals, a chip select signal /CS for identifying whether an input of a command which is a combination of these control signals /RAS, /CAS and /WE is valid or not, and a reference voltage signal Vref for comparing of L/H levels of input signals from the external, so that the control signal input buffer 5 generates internal control signals such as an internal clock enable CKEi and the like.

Furthermore, the DDR SDRAM 1 includes an address input buffer 6 which receives address signals Ai (i=0 to 11), bank address signals BAi (i=0 to 1) and the reference voltage Vref and which generates an internal address signal I Ai (i=0 to 11). The DDR SDRAM 1 further includes an input/output buffer 7 which receives input and output data signals DQi (i=0 to 15) and data strobe signals DQSi (i=0, 1) for controlling a timing of inputting the input/output data signals and which generates the input/output data signals DQi (i=0 to 15) in synchronized with the DLL output signals CLKd1 and CLKd2 sent from the clock generator 3. The DDR SDRAM 1 further includes a command decoder/ internal controller unit 8 which decodes the internal control signals from the control signal input buffer 5 and determines a designated operational mode and which generates an internal operational mode designating signal in synchronized with the internal clock signal CLKi from the clock generator 3.

Furthermore, the DDR SDRAM 1 includes an internal address generator 9, a data bus 10 and a DLL control unit 12, where the internal address generator 9 receives the internal address signals IAi from the address input buffer 6 and generates an internal row/column address signal according to a control signal from the command decoder/internal controller unit 8. The data bus 10 transfers input write data from the input/output buffer 7 to the memory array 2 and transfers the output read data from the memory array 2 to the input/output buffer 7. The DLL control unit 12 receives the internal clock enable signal CKEi from the control input signal buffer 5 and generates a DLL control signal DLLA for controlling an activation of the clock generator 3.

Figure 2:
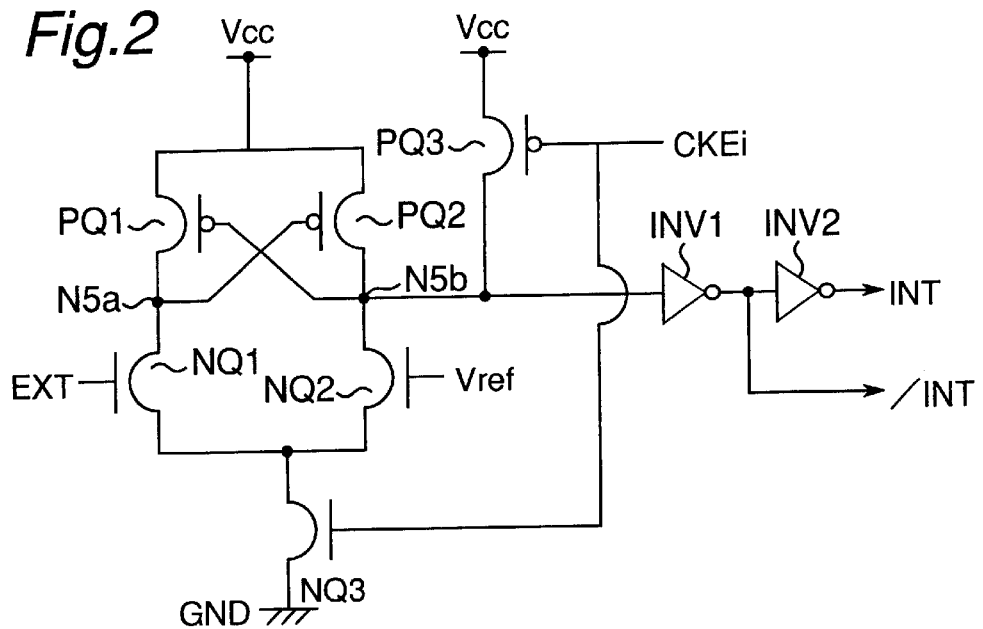
FIG. 2 is a circuit diagram showing a control inputting buffer circuit of the first embodiment of the present invention.

FIG. 2 is a diagram showing a constitution of each buffer portion 5a included in the control signal input buffer 5 shown in FIG. 1.

Each buffer portion 5a is provided corresponding to the external control signals /RAS, /CAS, /WE and /CS, and these external control signals are depicted here as "EXT" in FIG. 2. The buffer portion 5a is controlled by the internal clock enable signal CKEi generated in response to the clock enable signal CKE to compare the external control signal EXT and the reference voltage signal Vref, and thereby generating internal control signals INT and /INT according to the comparison results.

In FIG. 2, the external control signal EXT is inputted to a gate of NMOS transistor NQ1 and the reference voltage Vref is inputted to a gate of NMOS transistor NQ2. Moreover, a gate of PMOS transistor PQ2 is connected to both a drain of PMOS transistor PQ1 and a drain of NMOS transistor NQ1, forming a node N5a. A gate of PMOS transistor PQ1 is connected to both a drain of PMOS transistor PQ2 and a drain of NMOS transistor NQ2, forming a node N5b. The node N5b outputs the internal control signal /INT via a first inverter INVI, and further outputs the internal signal INT via a second inverter INV2.

Moreover, NMOS transistor NQ3 is provided between sources of NMOS transistors NQ1 and NQ2 and a grounding conductor GND, while a PMOS transistor PQ3 is provided between the node N5b and a power voltage line Vcc, and the internal dock enable signal CKEi is inputted to the gates of the NMOS transistor NQ3 and PMOS transistor PQ3.

It should be noted that, concretely, in accordance with the external control signals /CS, /RAS, /CS, /WE inputted to the control input signal buffer 5, the internal control signals /CSi, /RASi, /CASi and /WEi are generated as the internal control signals INT, and the control signals CSi, RASi, CSi and WEi are generated as the internal control signal /INT are generated from the control signal input buffer 5.

Next, an outline of an operation of the buffer portion 5a will be described below.

When the internal clock enable signal CKEi is H level, current flows through the NMOS transistor NQ3, so that the internal control signals INT and /INT are varied by the external control signals EXT. When the internal clock enable signal CKEi is L level, current does not flow through the NMOS transistor NQ3, and the node N5b is H level by the PMOS transistor PQ3 and the internal control signals INT and /INT are H and L levels, respectively.

As is described above, although the buffer portion 5a of the control input signal buffer 5 has been described, a similar buffer 5a is provided in the address input buffer 6, and the operational description thereof is omitted here.

Figure 3:
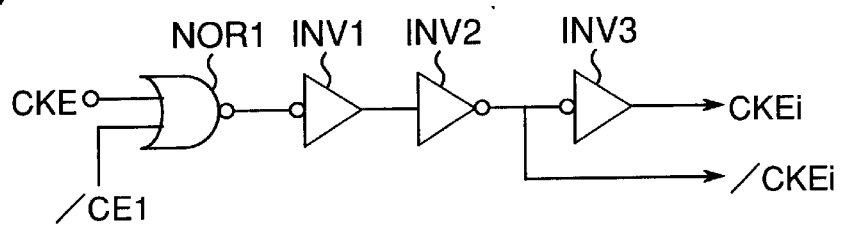
FIG. 3 is a circuit diagram showing a control inputting buffer circuit of the first embodiment of the present invention.

FIG. 3 is a diagram showing a constitution of a buffer portion 5b included in the control signal input buffer 5 shown in FIG. 1, which corresponds to the clock enable signal CKE. In this construction, to NOR circuit NOR 1, the clock enable signal CKE and an activation signal /CE1 generated inside of the DDR SDRAM 1 are inputted, and the interval clock enable signal CKEi is generated through the inverters INV1–INV3, and an internal clock enable signal /CKEi is generated through the inverters INV1–INV2.

Regarding the command decoder/internal controller circuit 8 shown in FIG. 1, a combination of control signals is inputted to the control input signal buffer 5 for use as a command at a time of rise of an external clock signal CLKe, and then the command decoder/internal controller circuit 8 generates an operational mode designation signal designated according to this input command.

For example, when a row access designation command designating row selection is inputted to the control input signal buffer 5, the command decoder/internal controller unit 8 outputs a row access activation signal ROWA, and when a column access designation command designating column selection is inputted, it outputs a column access activation signal COLA.

Moreover, in a state where the clock enable signal CKE is inputted at H level, when the control signal /CAS, /CS are inputted at L level and the control signals /RAS, /WE are inputted at H level at a rise of the external clock signal CLKe, the command decoder/internal controller unit 8 outputs a read operation activation signal READ for activating a read operation.

Moreover, when the control signal /WE is at L level and the other signals are in the same conditions as the above described, the command decoder/internal controller unit 8 outputs a write operation activation signal WRITE for activating a write operation.

Furthermore, in a state where the clock enable signal CKE is inputted at H level, when the control signals /RAS, /CAS and /CS are inputted at L level and the control signal /WE is inputted at H level at a rise of the external clock signal CLKe, a refresh mode called as an auto refresh mode is set, and a refresh operation is performed on the basis of an address of a refresh address counter within the internal address generator unit 9 to be described later.

Figure 4:
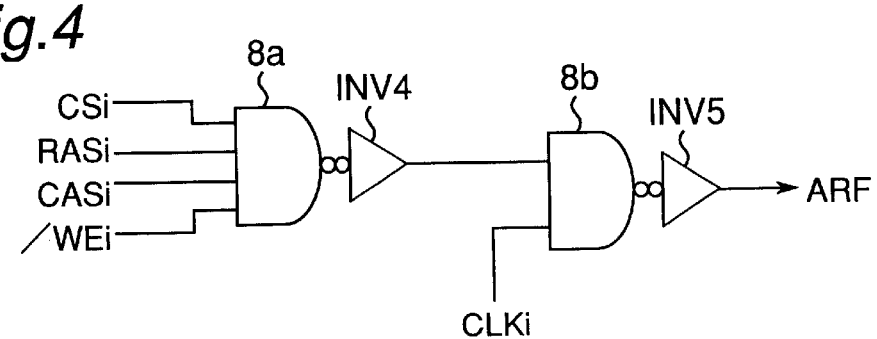
FIG. 4 is a circuit diagram showing a command decode/internal control circuit of the first embodiment of the present invention.

As shown in FIG. 4, the command decoder/internal controller unit 8 includes a NAND circuit 8a which receives the internal control signals CSi, RASi, CASi and /WEi from the control input signal buffer 5 as the input signals, an inverter INV4 connected to the NAND circuit 8a, a NAND circuit 8b connected to the inverter INV4 and an inverter INV5 connected to the NAND circuit 8b. Thus, the above described four internal control signals CSi, RASi, CASi and /WEi are inputted and a timing is controlled by the internal clock signal CLKi inputted to the clocked NAND circuit 8b, and the auto refresh designation signal ARF is generated as an output signal from the inverter INV5 for designating the auto refresh mode.

Figure 5:
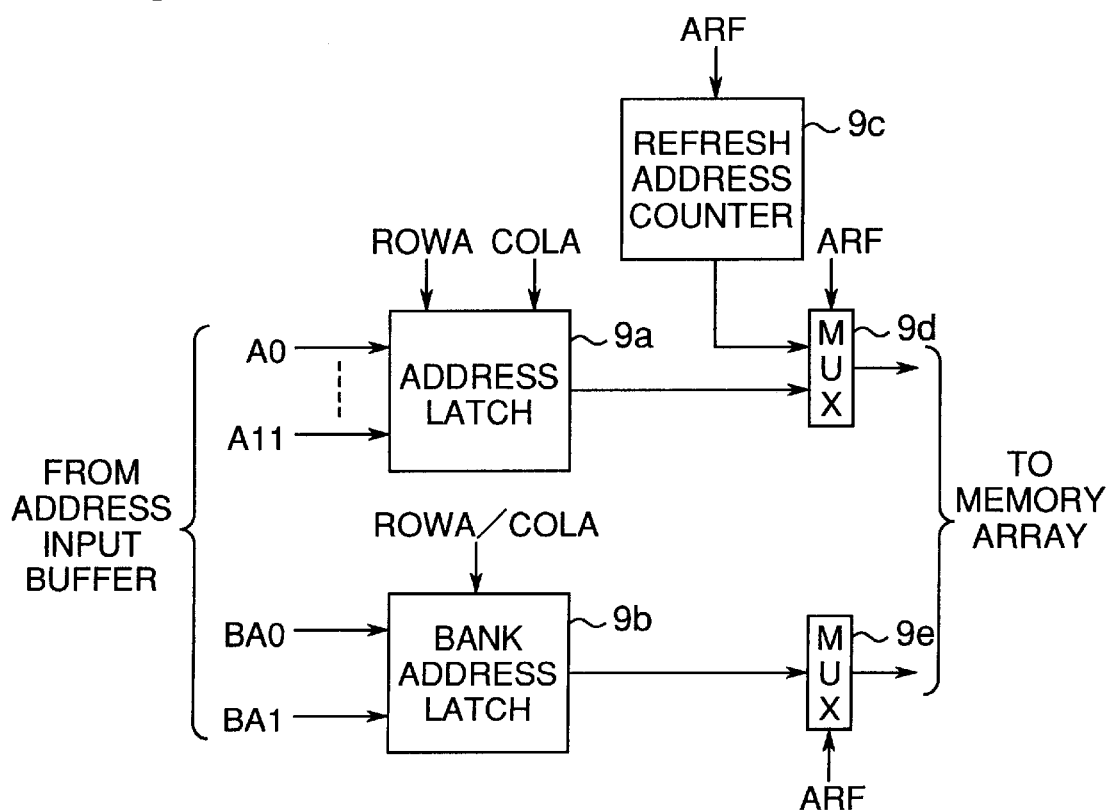
FIG. 5 is a circuit diagram showing an internal address generation circuit of the first embodiment of the present invention.

FIG. 5 shows an outline of the constitution of the internal address generator unit 9 shown in FIG. 1.

In FIG. 5, the internal address generator unit 9 includes an address latch 9a for latching an internal address signal Ai (i=0-11) given from the address input buffer 6 as address data according to the activation signals ROWA and COLA sent from the command decoder/internal controller unit 8, a bank address latch 9b for latching a bank address signal BAi as address data according to the activation signals ROWA and COLA, a refresh address counter 9c for counting the refresh address in accordance with the auto refresh designation signal ARF sent from the command decoder/internal controller unit 8 to thereby output an address signal, and a multiplexer (MUX) 9d for selecting the row address signal of either the refresh address counter 9c or the address latch 9a.

Similarly, there is included a multiplexer (MUX) 9e for selecting either all or one of the bank address signals BAi, and an auto refresh designation signal ARF is inputted to the multiplexers MUX 9d and MUX 9e for controlling in the auto refresh mode. The address latch 9a latches an address signal given from the address input buffer 6 as a row address signal during activation of the row access activation signal ROWA. The address latch 9a also latches an address signal as a column address signal during the activation of the column access activation signal COLA. The bank address latch 9b latches an bank address signal given from the address input buffer 6 during the activation of the row access activation signal ROWA or column access activation signal COLA.

The memory array portion 2 as shown in FIG. 1 receives the operation mode designation signals from the command decoder/internal controller unit 8 and address signals (including bank address signals) from the internal address generator unit 9 and executes an operation designated for a bank subject to address designation.

Figure 6:
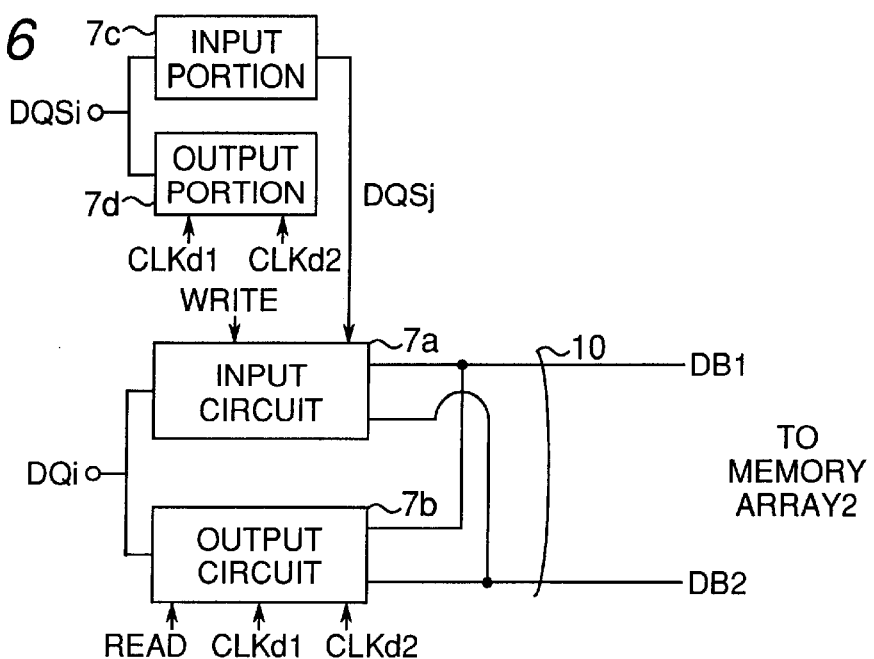
FIG. 6 is a circuit diagram showing an inputting and outputting buffer circuit of the first embodiment of the present invention.

FIG. 6 shows an outline of the constitution of the input/output buffer 7 shown in FIG. 1.

In FIG. 6, the input/output buffer 7 includes an input circuit 7a and an output circuit 7b for the input and output data signal DQi (i=0–15), and an input portion 7c and an output portion 7d for the data strobe signal DQSi for use as a timing signal of the input and output signal DQi.

The data strobe signal DQSi is inputted to the input portion 7c as an input signal during the write operation, and then the internal data strobe signal DQSj is sent from the input portion 7c to the input circuit 7a for the input and output data signal DQi.

On the other hand, an output portion 7d outputs a signal in synchronized with the DLL output signals CLKd1 and CLKd2 from the clock generator 3 during a read operation. The input circuit 7a is activated by the write operation activation signal WRITE sent from the command decoder/internal controller unit 8. In the case where the write operation activation signal WRITE is an activation signal, an input and output data signal DQi is inputted in synchronized with the internal data strobe signal DQSj to the input circuit 7a, and then sent to DB, /DB of the data bus 10 as a complementary signal, and transmitted to the memory array 2. Subsequently, the data is written in a memory cell in accordance with an address selected in the memory array 2.

Meanwhile, in the case where the write operation activation signal WRITE is an inactivation signal, since the input circuit 7a is in a state of inactivation, data is not inputted. On the other hand, the output circuit 7b is activated by the read operation activation signal READ from the command decoder/internal controller unit 8.

In the case where the read operation activation signal READ is an activation signal, the data is read out from the memory cell of the address selected in the memory array 2, and transmitted to the output circuit 7b via DB and /DB of the data bus 10, the and then outputted as the output data DQi in synchronized with the DLL output signal CLKd1 or CLKd2.

Therefore, the output circuit 7b can be referred to as a clock synchronization circuit in synchronized with clock signals of the DLL output signals CLKd1 and CLKd2. In the case where the read operation activation signal READ is an inactivation signal, since the output circuit 7b is in a state of inactivation, data is not outputted.

Figure 7:
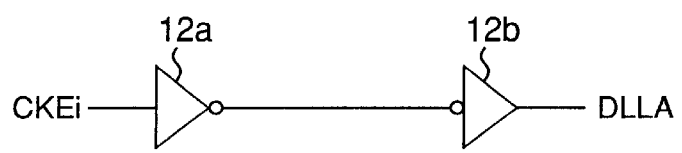
FIG. 7 is a circuit diagram showing a DLL control circuit of the first embodiment of the present invention.

FIG. 7 shows an outline of the constitution of the DLL control unit 12 shown in FIG. 1.

In FIG. 7, the internal clock enable signal CKEi sent from the control input signal buffer 5 is inputted to the DLL control circuit 12 and the DLL control signal DLLA is outputted via inverters 12a and 12b.

Figure 8:
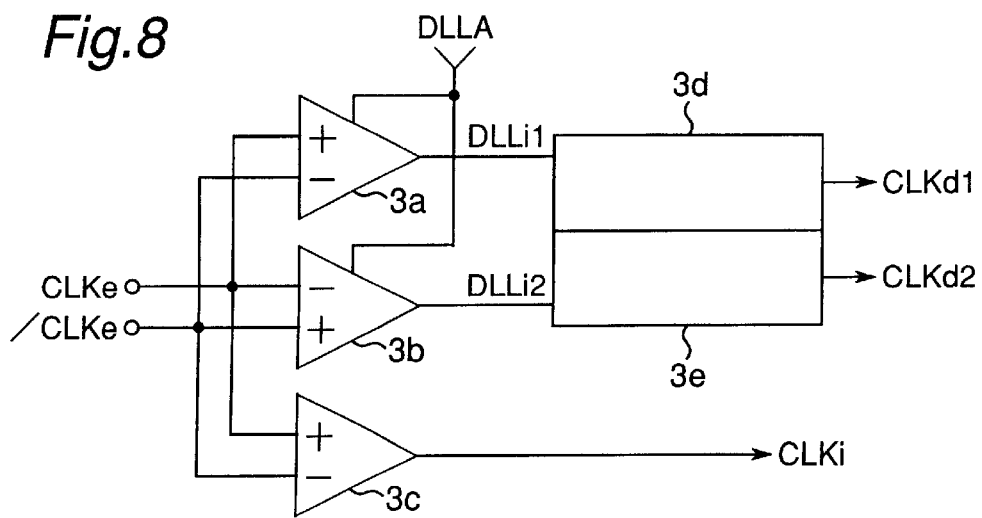
FIG. 8 is a circuit diagram showing a clock generator of the first embodiment of the present invention.

FIG. 8 shows an outline of the constitution of the clock generator 3 shown in FIG. 1.

In FIG. 8, the clock generator 3 includes a comparators 3a and 3b which are controlled by the DLL control signal DLLA from the DLL control unit 12 to compare the external clock signals CLKe and /CLKe and generate DLL input signals DLLi1 and a DLLi2, respectively, and a comparator 3c for comparing the external clock signals CLKe and /CLKe and generating an internal clock signal CLKi. The clock generator 3 further includes a pair of DLL circuits 3d and 3e, where the DLL circuit 3d is one of the clock generator circuits for generating the DLL output signal CLKd1 in response to receipt of a DLL input signal DLLi1 and the DLL circuit 3e is one of the clock generator circuits for generating the DLL output signal CLKd2 in response to receipt of a DLL input signal DLLi2. The comparators 3a–3c, although not having the inverter INV2 are different from the circuit shown in FIG. 2, in other respects, have similar constitutions to that of the circuit shown in FIG. 2. However, only the comparator 3c is supplied with a power supply voltage Vcc instead of an internal clock enable signal CKEi. For example, in the comparator 3a, EXT is corresponding to /CLKe, Vref is corresponding to CLKe, and /INT is corresponding to DLLi1.

The DLL circuit 3d delays the DLL input signal DLLi1 and generates the DLL output signal CLKd1 of which time difference to the DLL input signal DLLi1 is made constant. Similarly, the DLL circuit 3e delays the DLL input signal DLLi2 and generates the DLL output signal CLKd2 of which time difference to the DLL input signal DLLi2 is made constant.

Figure 9:
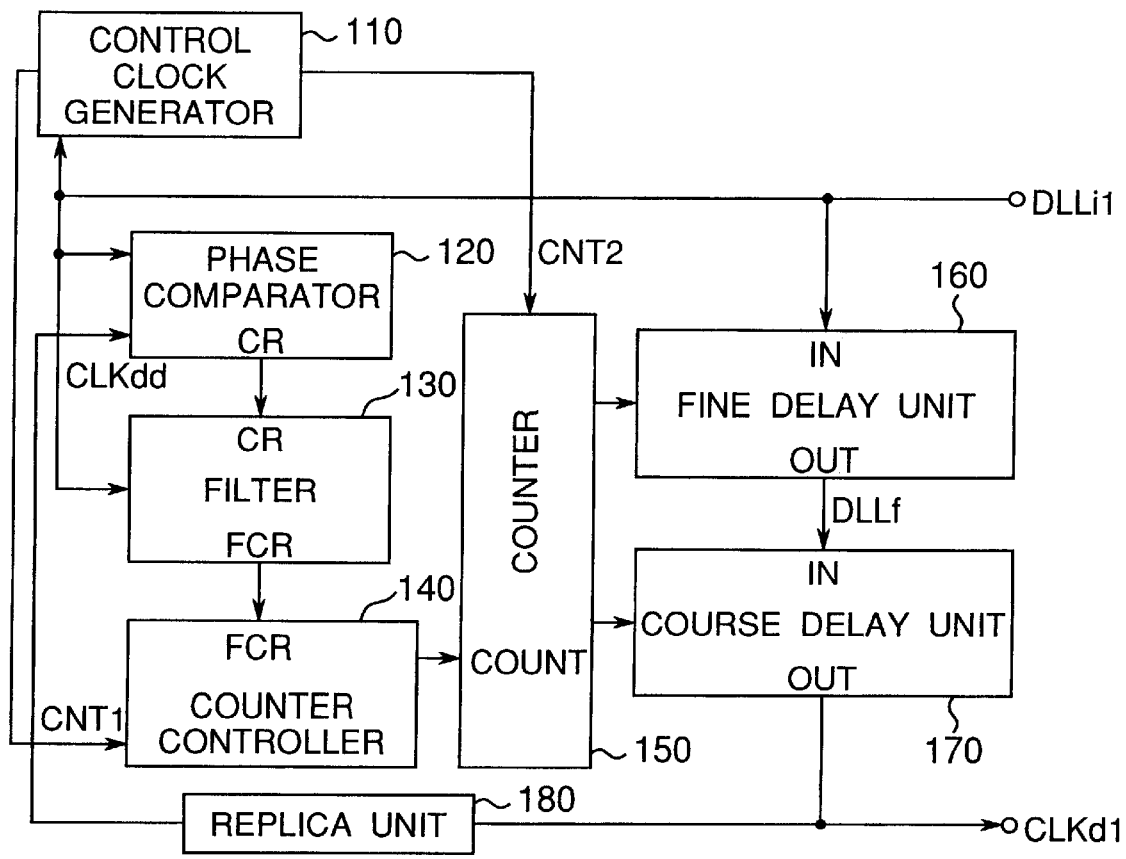
FIG. 9 is a circuit diagram showing a DLL circuit of the first embodiment of the present invention.

FIG. 9 shows an outline of the constitution of the DLL circuit 3d shown in FIG. 8.

It should be noted that since the DLL circuit 3e has the same constitution as the DLL circuit 3d except that input and output signals of the DLL circuit 3d are different from those of the DLL circuit 3e, hereinafter, the DLL circuit 3d is referred to as a represented one.

The DLL circuit 3d includes a control clock generator 110, a phase comparator 120, a filter 130, a counter controller 140, a counter 150, a fine delay unit 160, a course delay unit 170 and a replica unit 180.

The control clock generator 110 generates a clock for controlling the entire DLL circuit, and outputs the first control signal CNT1 to the counter control circuit 140 and outputs the second control clock signal CNT2 to the counter 150, respectively, on the basis of the DLL input signal DLLi1.

The replica unit 180 is a dummy circuit for generating a delay amount equivalent to a sum of first and second signal delay amounts, where the first signal delay amount is calculated from the time when the external clock signals CLKe and /CLKe are inputted to the time when they are inputted as a DLL input signal DLLi1 to the DLL circuit 3d and the second signal delay amount is calculated from the time when DLL output signal CLKd1 is transmitted from the DLL circuit 3e to the output circuit 7b shown in FIG. 6. DLL output signal CLKd1 is inputted to the replica unit 180 for delay and a replica delay signal CLKdd is outputted to the phase comparator 120. The phase comparator 120 compares phases of the DLL input signal DLLi1 and replica delay signal CLKdd, and outputs a comparative results signal CR to the filter 130.

The filter 130 synchronizes with the DLL input signal DLLi1, determines variation of a certain time period of the comparative results signal CR from the phase comparator 120, and if the comparative results signal CR is constant, a final comparative results signal FCR is outputted to the counter control circuit 140.

The counter control circuit 140 synchronizes with the first control clock signal CNT1, and on the basis of the final comparative results signal FCR sent from the filter 130, a count designating signal COUNT is outputted to the counter 150. The counter 150 synchronizes with the second control clock signal CNT2, and counts up or counts down on the basis of the count designating signal COUNT sent from the counter control circuit 140.

It should be noted that counting up causes increasing of a delay amount in the fine delay circuit 160 and the course delay circuit 170 and counting down causes decreasing of a delay amount to the contrary.

The counter 150 outputs count data a0–a2 and a3–a5, which are count results, to the fine delay circuit 160 and the course delay circuit 170, respectively, where it should be noted that least significant bit of count data is a0 and most significant bit of count data is a5.

Moreover, in the case where all of the a0–a5 is at L level, count data is the minimum value of count number, then a delay amount is minimum in the fine delay circuit 160 and the course delay circuit 170, and in the case where all of the a0–a5 is H level, count data is the maximum value of count number, then a delay amount in the fine delay circuit 160 and the course delay circuit 170 is the maximum. The fine delay circuit 160 is the delay circuit which makes such delay amount that is extremely smaller than the course delay circuit 170 to be varied.

The fine delay circuit 160 selects a delay amount on the basis of the count data a0–a2 and delays a DLL input signal DLLi1 and outputs a fine delay signal DLLf to the course delay circuit 170. The course delay circuit 170 selects a delay amount on the basis of the count data a3–a5 and delays a fine delay signal DLLf, and outputs a DLL output signal CLKd1. The DLL output signal CLKd1 is not only an output signal of the DLL circuit 3d, but also an input signal of the replica unit 180. In this way, a DLL output signal CLKd1 is fed back to the replica unit 180, and a delay amount is controlled.

Next, an operation of the DDR SDRAM 1 of the present embodiment will be described below.

Figure 10:
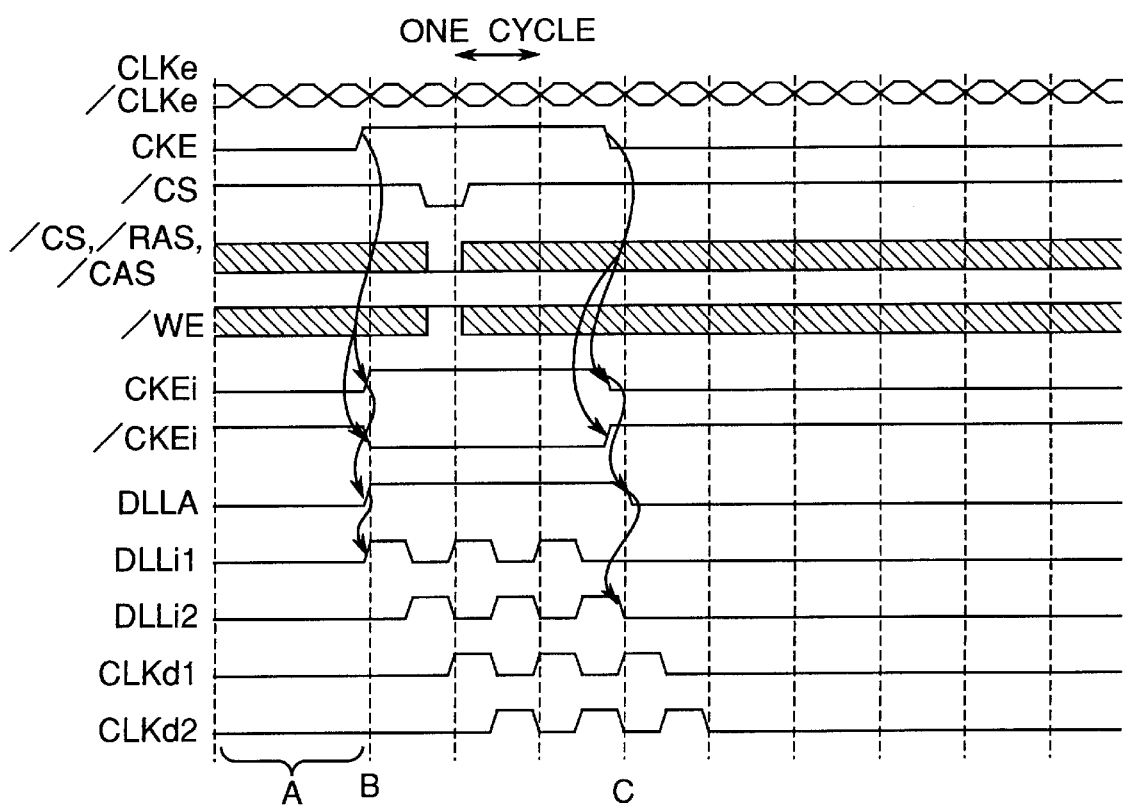
FIG. 10 is a diagram showing an operational timing of a DDR SDRAM of the first embodiment of the present invention.

FIG. 10 shows main operation timings of the DDR SDRAM 1 shown in FIG. 1. In FIG. 10, complementary external clock signals CLKe and /CLKe are inputted from the external in a certain constant time period.

Supposing here that, as shown in FIG. 10, one cycle spans over between an intersection of the complementary external clock signals CLKe and /CLKe and a next similar intersection thereof where the level of the external clock signal CLKe is changed from L level to H level while the level of the external clock signal /CLKe is changed from H level to L level, and vice versa.

In a time period A shown in FIG. 10, since the level of a clock enable signal CKE is L level, this period indicates a power down mode in a state where a command made by combination of the external control signals is not inputted. In this period, since the level of a clock enable signal CKE is L level, the level of an internal clock enable signal CKEi is also L level. Furthermore, corresponding to this L level, the level of a DLL control signal DLLA, which is an output signal of the DLL controller unit 12 shown in FIG. 8, is also L level.

Therefore, the comparators 3a and 3b in the clock generator 3 shown in FIG. 8 are in a state of inactivation, the levels of a DLL input signal DLLi1 and a DLLi2 are fixed at L level, and the DLL circuits 3d, 3e are also in a state of inactivation. Consequently, DLL output signals CLKd1 and CLKd2 are also at L level, and the clock generator does not generate a clock signal in accordance with the external clock signal CLKe and /CLKe in this period.

Next, the operation is described below in a time period spanning over from a time B to a time C shown in FIG. 10.

In a time B+1 cycle, since a chip select signal /CS and control signals /RAS, /CAS are at L level and a control signal /WE is at H level, this period indicates a state where auto refresh command is inputted.

Corresponding to this state, the level of an internal clock enable signal CKEi is changed to H level, and further the level of a DLL control signal DLLA is also changed to H level.

Therefore, the comparators 3a and 3b in the clock generator 3 shown in FIG. 8 are in a state of activation, and DLL input signals DLLi1 and DLLi2 are used as the clock signals corresponding to the external clock signals CLKe and /CLKe.

Accordingly, the DLL circuits 3d, 3e are also activated, and after one cycle from the time point where the level of the clock enable signal CKE become H level, the DLL output signals CLKd1 and CLKd2 are in turn outputted corresponding to the external clock signals CLKe and /CLKe. By activating the DLL circuits 3d and 3e, a delay amount sum is set in this time period.

Next, in a time period after the time point C in FIG. 10, the level of the clock enable signal CKE is L level at the time point C, which indicates a period of a power down mode again. Corresponding to this mode, the level of the internal clock enable signal CKEi is changed to L level, and further the level of the DLL control signal DLLA is also changed to L level.

Therefore, the comparators 3a and 3b in the clock generator 3 shown in FIG. 8 is in a state of inactivation, and the level of the DLL input signals DLLi1 and DLLi2 is fixed to L level.

Accordingly, the DLL circuits 3d and 3e are also inactivated, and after one cycle from the time C when the level of the clock enable signal CKE is L level, the DLL output signals CLKd1 and CLKd2 are fixed to L level in accordance with the external clock signals CLKe and /CLKe, and the clock generator does not generate a clock signal.

Moreover, in any case of the power down mode and the auto refresh mode, a write operation activation signal WRITE and a read operational activation signal READ from the command decoder/internal controller unit 8 are in a state of inactivation, and the input circuit 7a and the output circuit 7b of the input/output buffer 7 are in a state of inactivation.

It should be noted that although the power down mode and the auto refresh mode are shown in FIG. 10, since the clock enable signal CKE is at H level in the read operation and write operation (although not shown), the DLL control signal DLLA is at H level. Therefore, the DLL circuits 3d, 3e are in a state of activation, the DLL output signals CLKd1 and CLKd2 are outputted corresponding to the external clock signals CLKe and /CLKe. For example, during a read operation, an input and output signal DQi is outputted from the output circuit 7b shown in FIG. 6 corresponding to the DLL output signals CLKd1 and CLKd2. Therefore, the read/write and the like operations are similar to conventional ones.

Figure 11:
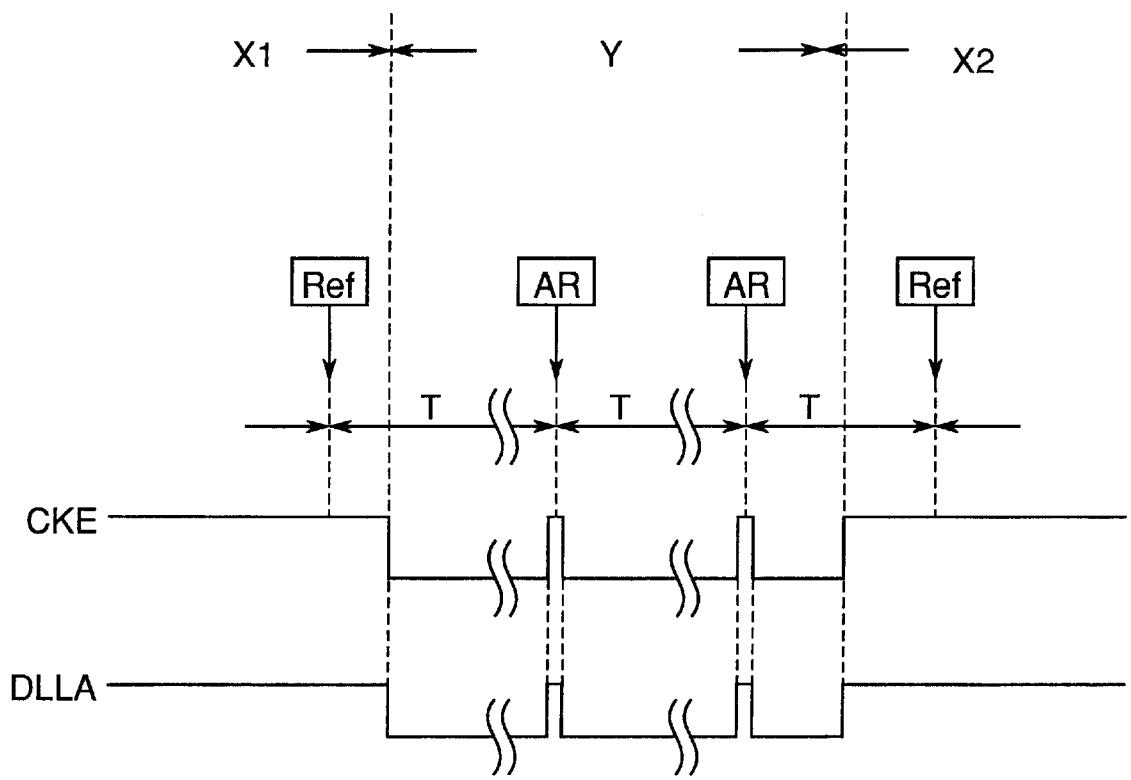
FIG. 11 is a diagram showing an operational timing of a DDR SDRAM of the first embodiment of the present invention.

FIG. 11 is a timing diagram showing an outline of an operation of the present embodiment in a longer time period than that of FIG. 10, and showing operations of a clock enable signal CKE and a DLL control signal DLLA.

X1 and X2, which are time periods, during which a clock enable signal CKE is serially at H level, is in an active state, the level of a DLL control signal DLLA is H level, and the DLL circuit 3d (3e) is in a state of activation.

On the other hand, in a time period Y during which a clock enable signal CKE is at L level, but a clock enable signal CKE becomes at H level in a pulse state by the auto refresh command AR inputted as a control signal every certain time period T is in the power down mode, and the DLL control signal DLLA becomes at H level in a pulse state every certain time period T, the DLL circuit is in a state of activation. However, in other intervals, the DLL control signal DLLA is at L level, and the DLL circuit is in a state of inactivation.

Next, a state of inactivation of the DLL circuit 3d in the case where a DLL input signal DLLi1 is at L level will be described below.

As shown in FIG. 9, when a DLL input signal DLLi1 is at L level, since a clock signal is not inputted to the control clock generator 110, an operation is halted, the first and second control signals CNT1 and CNT2 are also in a constant state, and operations of the counter controller 140 and the counter 150 are halted. The DLL input signal DLLi1 passes through the fine delay unit 160 and the course delay unit 170, a DLL output signal CLKd1 becomes at L level, and an output signal CLKdd of the replica unit 180 also becomes L level.

Moreover, since two comparative input signals of the phase comparator 120 are also at L level, a clock signal is not inputted and an operation is halted. Furthermore, since an input control signal DLLi1 of the filter 130 is at L level, an operation is halted. Accordingly, an operation of each portion in the DLL circuit 3d is halted, therefore, an operation current based on a clock signal does not flow.

Moreover, even if each signal of the DLL circuits is not fixed from the external, inactivation of the DLL circuits 3d and 3e is achieved by fixing the level of the input signals DLLi1 and DLLi2 and consuming current is suppressed.

As described above, in the present embodiment, a DLL control signal DLLA is generated by the DLL controller unit 12 on the basis of the clock enable signal CKE, and activation of the DLL circuits 3d, 3e is controlled by controlling the input signals DLLi1 and DLLi2 of the DLL circuits 3d, 3e. By this constitution, the DLL circuit is inactivated in the power down mode, and is intermittently activated in the pulse-like auto refresh mode (AR).

Accordingly, consuming current can be remarkably reduced by inactivating the DLL circuit in the power down mode.

Moreover, a delay amount of an internal clock signal can be controlled in specific intervals by intermittently operating the DLL circuit in the auto refresh mode.

It should be noted that the followings are noticed when the DLL circuit is considered to be controlled in the power down mode incorporating the auto refresh mode.

It has been noticed that among a number of DRAM circuits operating in the power down mode, the DLL circuit, which plays an important role in a timing control in a high speed operation, has a large influence on consuming current in the power down mode.

For example, when circuit simulation was performed in 128 M DDR (Double Data Rate) SDRAM incorporating the DLL circuit, the difference in the power down mode between consuming current of DLL circuit during activation and that of the same during inactivation resulted in 9 mA.

This occupies a large rate against the consuming current value 10 mA, which was determined by performing a simulation of the entire semiconductor device in the power down mode.

What is considered and speculated as a causative factor for a large consuming current exists in that the DLL circuit is operated by clock signal of high frequency, charging and discharging are in turn performed in a short time period, a time during which charge is accumulated in a node within each DLL circuit is relatively reduced and a large amount of charge flows from the source line to the grounding line in a short time period.

However, the reason for introducing the DLL circuit is to suppress occurrence of jitter of an internal dock signal and frequency variation generated due to the external factors such as temperature of a semiconductor device, variation of the source voltage, a variety of processes and the like.

Therefore, in order to correspond to the cases in which the external causative factors changes from time to time, conventionally, it is necessary to make the DLL circuit in a state of activation even in the power down mode, and suppression of consuming current in the power down mode was under the difficult circumstances.

So, as the present embodiment, it was contemplated that changes of the external factors from time to time is dealt with in certain intervals by inactivating the DLL circuit, reducing the consuming current and temporarily operating the DLL circuit with an auto refresh command inputted in specific time periods as a trigger in the power down mode and jitter of an internal clock signal is suppressed by setting delay amount by the DLL circuit.

It should be noted, for example, supposing that an external clock signal CLKe and /CLKe is operated at 133 MHz, the width of one cycle is 7.5 nsec and a time period during which the DLL circuit is activated is, for example, 4 cycles portion, an operation time period is 30 nsec per once.

On the other hand, since a time period T between refresh operation and refresh operation shown in FIG. 11 is 15.6 $\mu$ sec, the DLL operation time period in the power down mode is about 0.2%, the problem of consuming current is largely improved.

Moreover, in the present embodiment, since an internal clock enable signal CKEi generated on the basis of signals inputted from the external is used as an input signal of the DLL control circuit 12, activation and inactivation of the DLL circuit can be controlled by external signals.

It should be noted that, in order to activate the DLL circuit in specific time period, it may be good that a special control signal, which is not the combination of the signals inputted to an existing DDR SRAM and control signals, is inputted from the external.

However, like the present embodiment, activation of the DLL circuit can be easily performed in a specific time period by utilizing an auto refresh.

Furthermore, since an internal clock enable signal CKEi generated on the basis of signals inputted from the external is a pulse signal, a specific time period can be controlled corresponding to the width of a pulse from the external.

Embodiment 2

Figure 12:
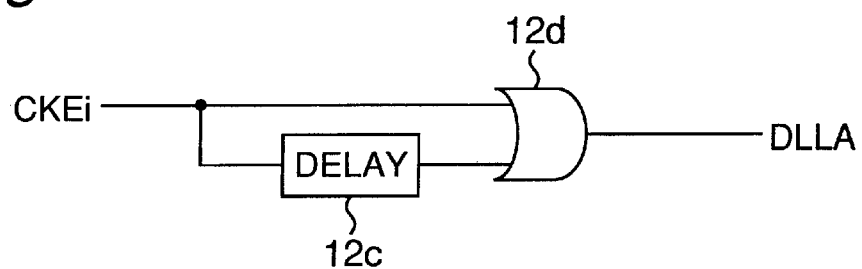
FIG. 12 is a circuit diagram showing a DLL control circuit of the second embodiment of the present invention.

FIG. 12 shows the DLL circuit 12 of the second embodiment of the present invention. In FIG. 12, both an internal enable signal CKEi and a signal which is obtained by delaying the internal clock enable signal CKEi by a delay portion 12c are inputted to an OR circuit 12d, which outputs a DLL control signal DLLA.

As for the DLL control circuit 12 of the second embodiment of the present invention, the DLL control signal DLLA immediately rises corresponding to a rise of the internal clock enable signal CKEi, however, a fall of the DLL control signal DLLA is delayed corresponding to a delay amount in the delay portion 12c for a fall of the internal clock enable signal CKEi.

For constitution of the delay portion 12c, for example, a plurality of steps of inverters are connected, or capacity and inverter are combined and the like.

It should be noted here supposing that a delay amount of the delay portion 12c is two cycles portion of an external clock signal CLKe and /CLKe when supposing certain clock frequency and that the inverter and the like are constituted so as to delay the fall of the DLL control signal DLLA.

Next, an operation of the DDR SDRAM 1 in the case where the DLL control circuit 12 of the second embodiment of the present invention will be described below with reference to FIG. 13, which is an operation timing diagram of the second embodiment of the present invention.

Figure 13:
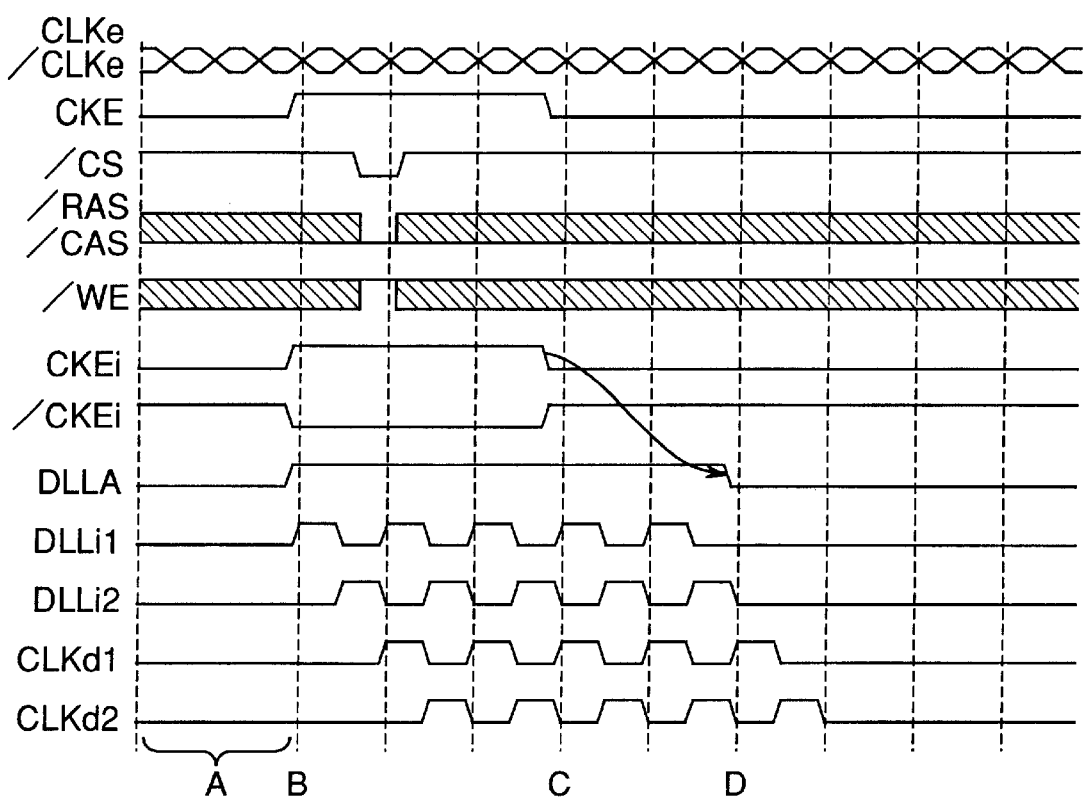
FIG. 13 is a diagram showing an operational timing of a DDR SDRAM of the second embodiment of the present invention.

It should be noted supposing that a time point after two cycles of an external clock signal CLKe and /CLKe from the time point C is a time point D in FIG. 13.

Differences in FIG. 13 from in FIG. 10 are a DLL control signal DLLA, DLL input signals DLLi1 and DLLi2, DLL output signals CLKd1 and CLKd2 after the time point C.

In FIG. 10, when the level of the clock enable signal CKEi is changed from H level to L level, the level of the DLL control signal DLLA is also changed from H level to L level. However, in FIG. 13, the DLL control signal DLLA is maintained at H level to nearby the time point D, and then the level thereof is changed from H level to L level.

Corresponding to this, a time period of DLL input signals DLLi1 and DLLi2, and DLL output signals CLKd1 and CLKd2 serving as clock signals are extended for two cycles of the external clock signals CLKe and /CLKe.

Figure 14:
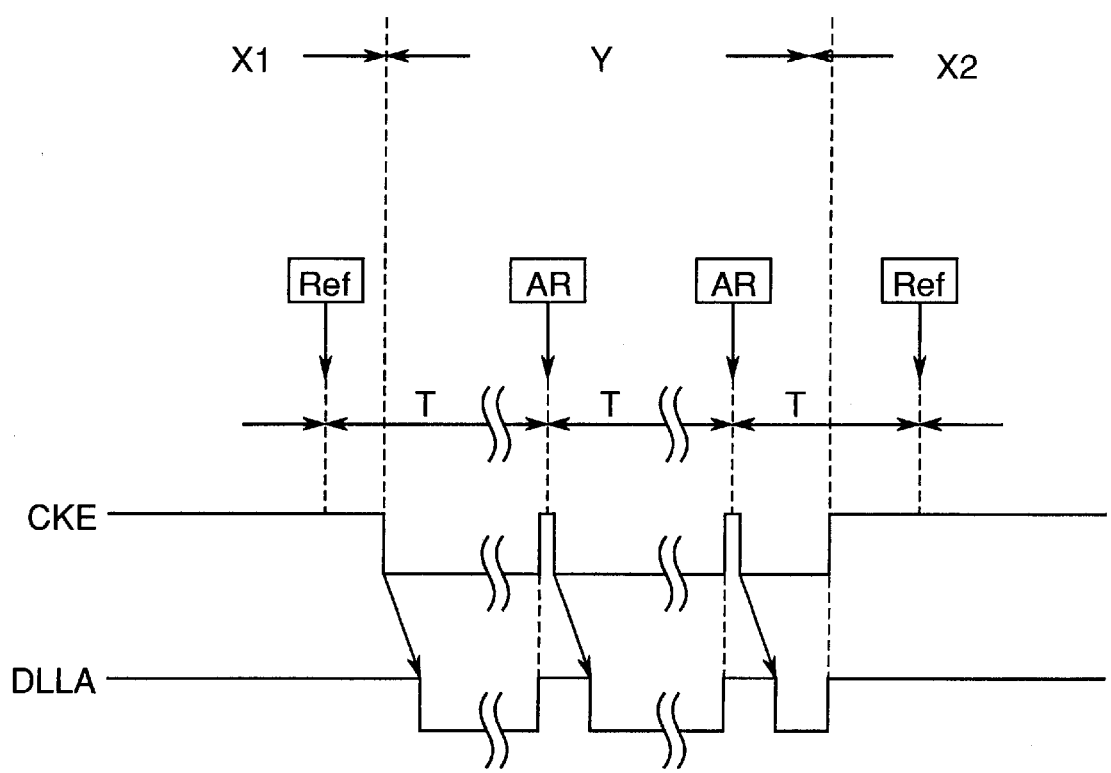
FIG. 14 is a diagram showing an operational timing of a DDR SDRAM of the second embodiment of the present invention.

FIG. 14 is a timing diagram showing an outline of an operation for a long time period of the second embodiment of the present invention similar to FIG. 11.

What FIG. 14 is different from FIG. 11 is in that a time period during which the DLL control signal DLLA is at H level as a pulse signal at certain time periods T in the power down mode Y is longer comparing to a time period during which a clock enable signal CKE is at H level as a pulse signal.

As described above, in the present embodiment, a fall of the DLL control signal DLLA, which is an output signal of the DLL control circuit, is delayed.

As a result, the DLL circuit can be in a state of activation not only for a time period during which a clock enable signal CKE is at H level in the auto refresh, but also for a longer time period.

Therefore, in the first embodiment, when the DLL circuit is in a state of inactivation in the power down mode, there is a possibility that an operation of the DLL circuit on the basis of a clock enable signal CKE in the auto refresh of a short period cannot sufficiently set a delay amount for the external factors. In contrast, in the second embodiment, a delay amount can be sufficiently set to the external factors, even an operation of periodical DLL circuit, using the delay portion 12c by controlling an activation time period of the DLL circuit.

It should be noted that, although in the present embodiment, the time period of activation of the DLL circuit is extended for two cycles portion of the external clock signal CLKe and /CLKe, it is possible to appropriately choose a time period extended depending on a control of the delay portion and the like and depending on conditions of the DLL circuit.

Moreover, although determination of an extended amount of an operation time period of the DLL in relation to the consuming current of the DLL circuit is required, since a time period T between two refresh operations Ref shown in FIG. 14 is 15.6 μ sec, it is expected that there will be no problem when the DLL circuit is operated during 1.5 μ sec, which is about one-tenth of that time period T.

The reason for this expectation is, as described in the first embodiment of the present invention, if an operation time period is about one-tenth as described above, the consuming current will be 0.9 mA of the DLL circuit and on a similar order of 1 mA of other circuit portions, although conventionally 9 mA of current was consumed in the DLL circuit.

Embodiment 3

Figure 15:
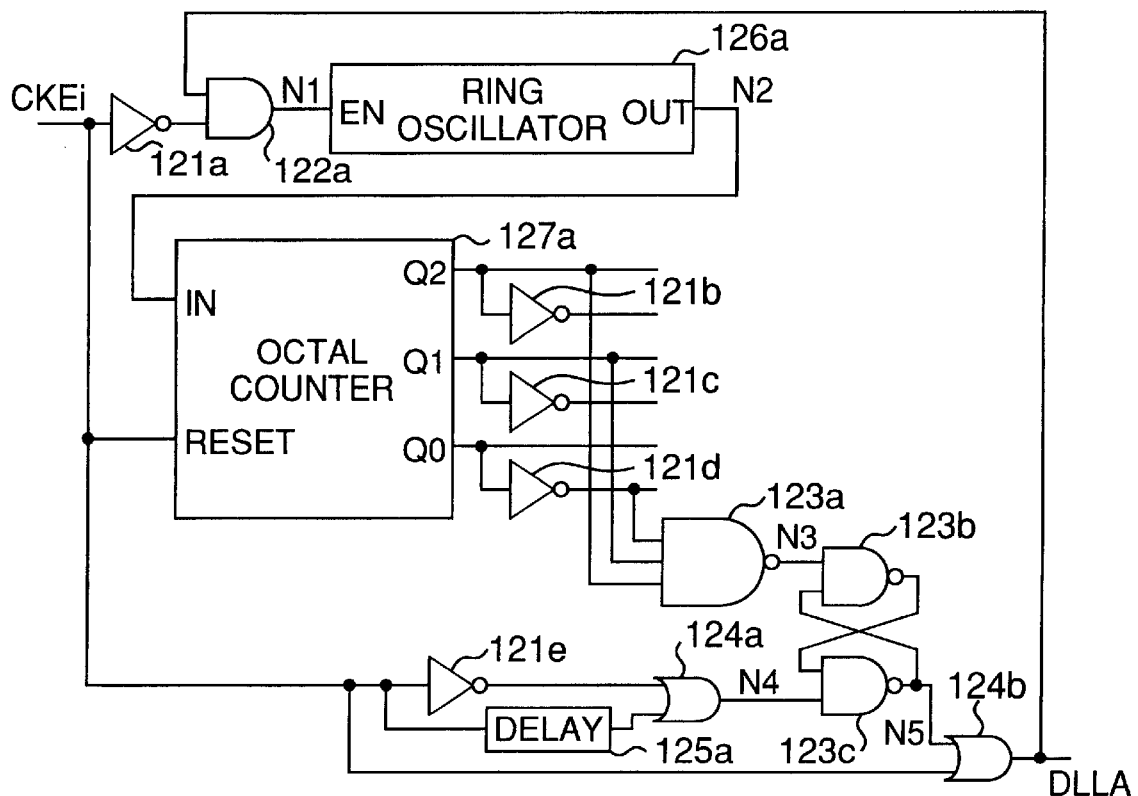
FIG. 15 is a circuit diagram showing a DLL control circuit of the third embodiment of the present invention.

FIG. 15 shows the DLL control circuit 12 of the third embodiment of the present invention.

In FIG. 15, reference numerals 121a–121e denote inverters, reference numeral 122a denotes an AND circuit, reference numerals 123a–123c denote NAND circuits, reference numerals 124a, 124b denote OR circuits and reference numeral 125a denotes a delay portion. Reference numeral 126a denotes a ring oscillator, and when an output signal N1 of the AND circuit 122a is at H level, it oscillates.

An output signal N2 of the ring oscillator 126a is a pulse signal, which is inputted to an octal counter 127a and the number of pulse of the pulse signal is counted. The octal counter 127a counts 8 pulses at maximum from a signal Q0 of least significant bit to a signal Q2 of most significant bit, and outputs a signal. Moreover, when an internal clock enable signal CKEi is at H level, the octal counter 127a is reset.

To the NAND circuit 123a, an output signal Q0 is inputted via the inverter 121d, and output signals Q1, Q2 are directly inputted, and when they are counted by 6 count method, an output signal N3 of the NAND 123a is at L level.

A flip-flop circuit is comprised of the NAND circuit 123b and 123c, and an output signal N5 is inputted to the OR circuit 124b, an output signal of the OR circuit 124b is a DLL control signal DLLA which is also fed back to the AND circuit 122a.

The inverter 121e, delay portion 125a and OR circuit 124a output one shot pulse of the L level side as an output signal N4 corresponding to the rise of the internal clock enable signal CKEi, which is an input to the NAND circuit 123c and the level of the output signal N5 of the NAND circuit 123c is made H level.

Figure 16:
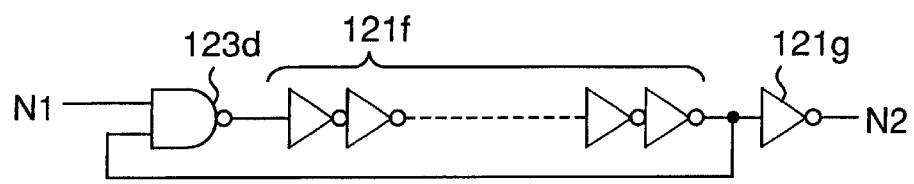
FIG. 16 is a circuit diagram showing a ring oscillator of the third embodiment of the present invention.

In FIG. 16, the constitution of the ring oscillator 126a is shown. The ring oscillator 126a is formed of an NAND circuit 123d, even number of pieces of inverters 121f and an output inverter 121g, and an input signal of the output inverter 121g is inputted also to the NAND circuit 123d. It will be good that the number of steps of the inverter 121f is appropriately selected depending on the width of a pulse.

Next, an operation of the third embodiment of the present invention will be described below.

Figure 17:
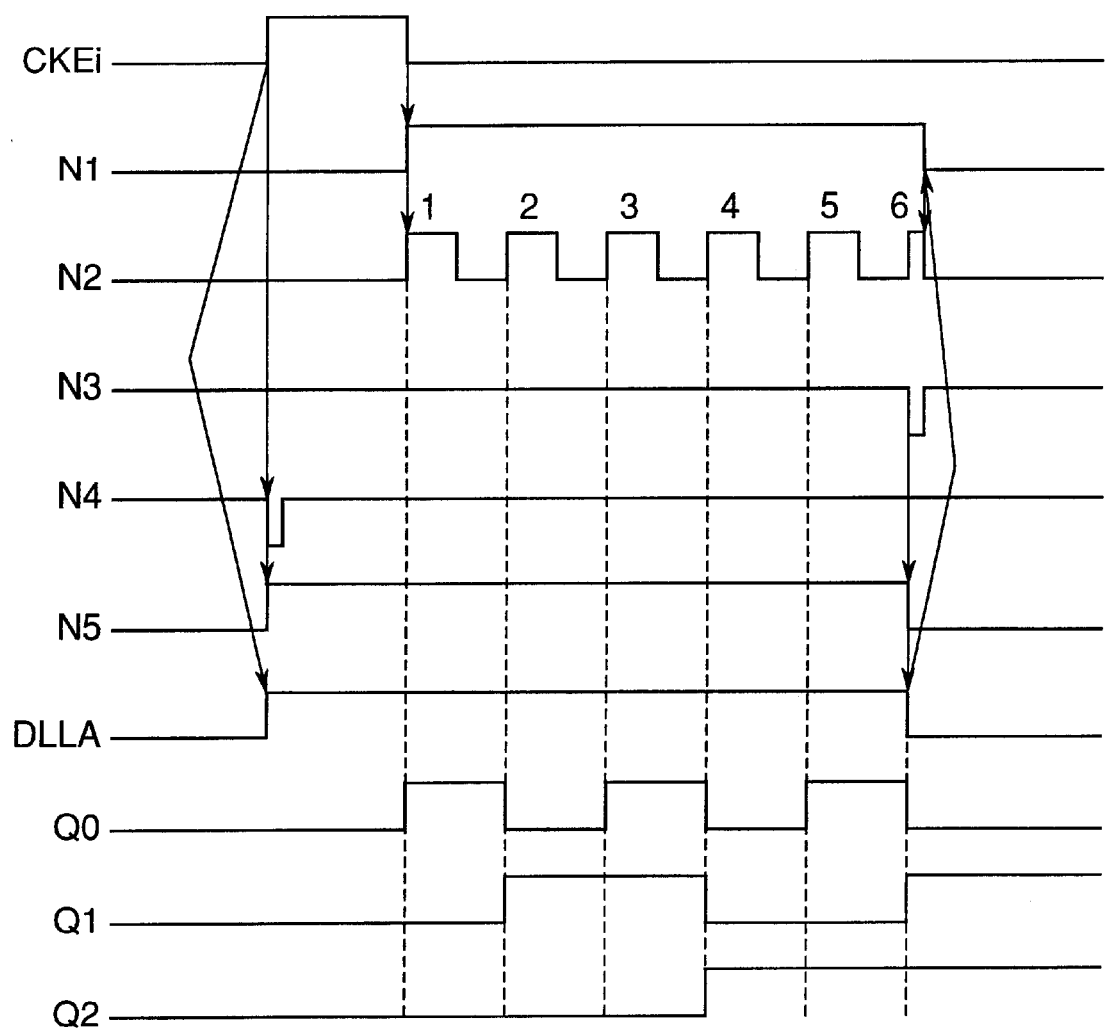
FIG. 17 is a diagram showing a DLL control circuit of the third embodiment of the present invention.

FIG. 17 shows a timing diagram of main signals. First, a pulse signal of an internal clock enable signal CKEi is inputted to the DLL control circuit 12. A DLL control signal DLLA, which is an output signal of the OR circuit 124b, is at H level corresponding to the rise of the internal clock enable signal CKEi. This means that the DLL control signal DLLA rises as a pulse signal, that is to say, an initiation of the pulse signal, and the DLL circuits 3d, 3e as shown in FIG. 8 are activated.

Then, corresponding to a width of a delay amount of the delay portion 125a, the level of the output signal N4 of the NOR circuit 124a is L level. Consequently, the output signal N5 of the NAND circuit 123c is at H level irrespective of the other input of the NAND circuit 123c.

Moreover, during a time period in which the internal clock enable signal CKEi is at H level, the octal counter 127a is reset.

Next, since two input signals of the AND circuit 122a are at H level by the fall of the internal clock enable signal CKEi, and accordingly an output signal N1 is at H level.

Consequently, the ring oscillator 126a oscillates, when the output signals of the octal counter become Q0=L, Q1=H and Q2=H, an output signal N3 of the NAND circuit 123a is at L level, an output signal of the NAND circuit 123b is at H level, then an output signal N5 of the NAND circuit 123c is at L level and the DLL control signal DLLA is at L level.

This means that a DLL control signal DLLA falls as a pulse signal, that is to say, the pulse signal is ended, and the DLL circuits 3d, 3e are inactivated. Consequently, the output signal N1 of the AND circuit 122a is also at L level, and the oscillation of the ring oscillator 126a is stopped.

As described above, in the third embodiment of the present invention, a pulse signal is generated within the DLL control circuit to be used, the end of the pulse signal of the DLL control signal DLLA is delayed. Consequently, the end of a pulse signal can be easily delayed compared to one forming a delay portion only with an inverter and resistor.

Moreover, a generation of a pulse signal within the DLL control circuit is performed in the ring oscillator, and the end of a pulse signal of the DLL control signal DLLA is made to be based on the measurement of the number of pulses of a pulse signal of the ring oscillator achieving the certain number of pulses using a counter for counting the number of pulses of the ring oscillator.

A pulse signal having a long width can be accurately made as a DLL control signal DLLA.

Moreover, although in the present embodiment, an octal counter is used as a counter, alternation is appropriately possible.

Moreover, it is not necessary to use the maximum count number as an output of the counter, but it will be good to appropriately select. Here, 6 count method is used since the internal clock enable signal CKEi has a certain width.

Embodiment 4

Figure 18:
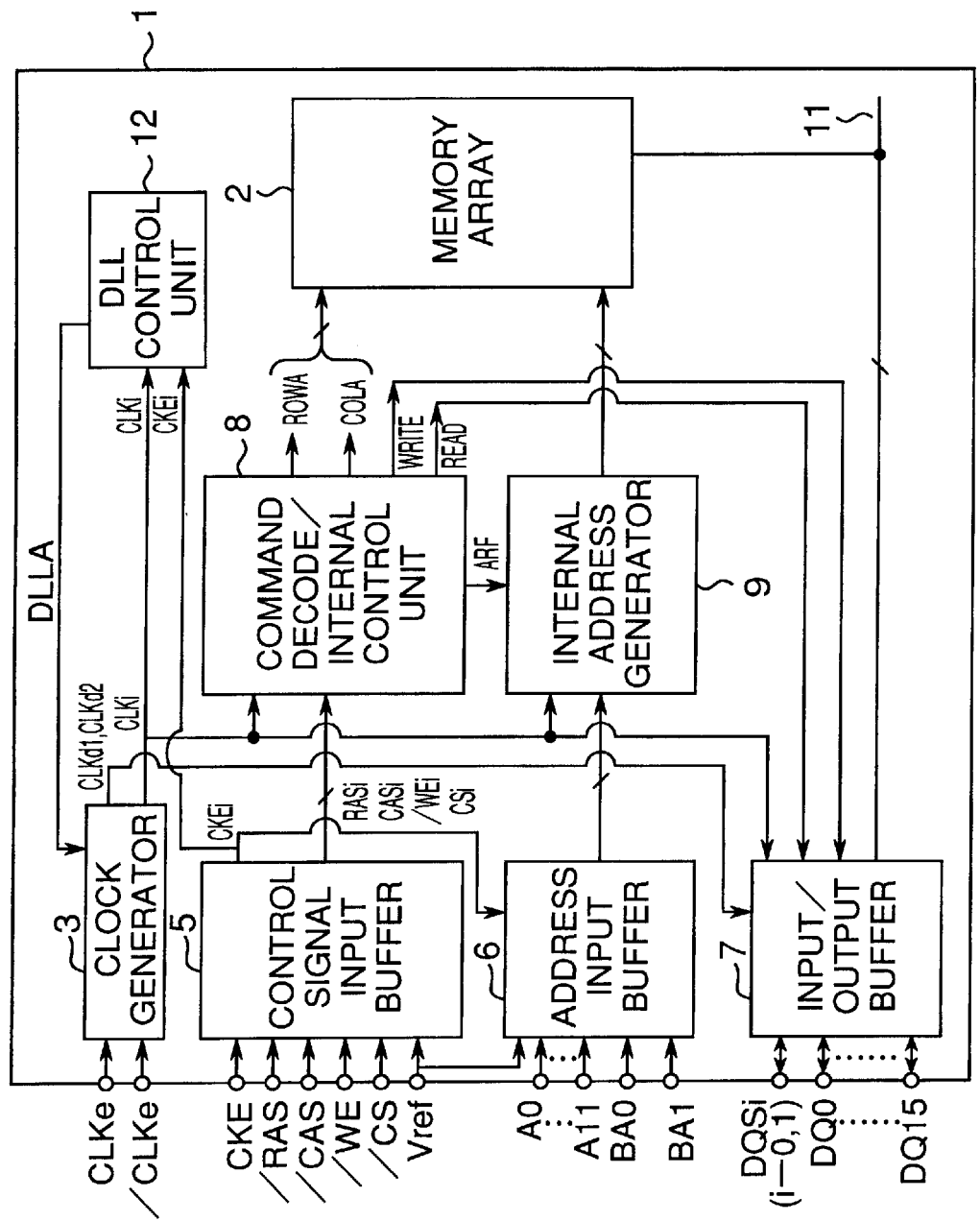
FIG. 18 is a schematic diagram showing the entire DDR SDRAM of the fourth embodiment of the present invention.

FIG. 18 is a schematic diagram showing the entire constitution of the DDR SDRAM 1 of the fourth embodiment of the present invention.

What FIG. 18 is different from FIG. 1 is in that an internal clock signal CLKi from the clock generator 3 is inputted to the DLL control circuit 12.

Figure 19:
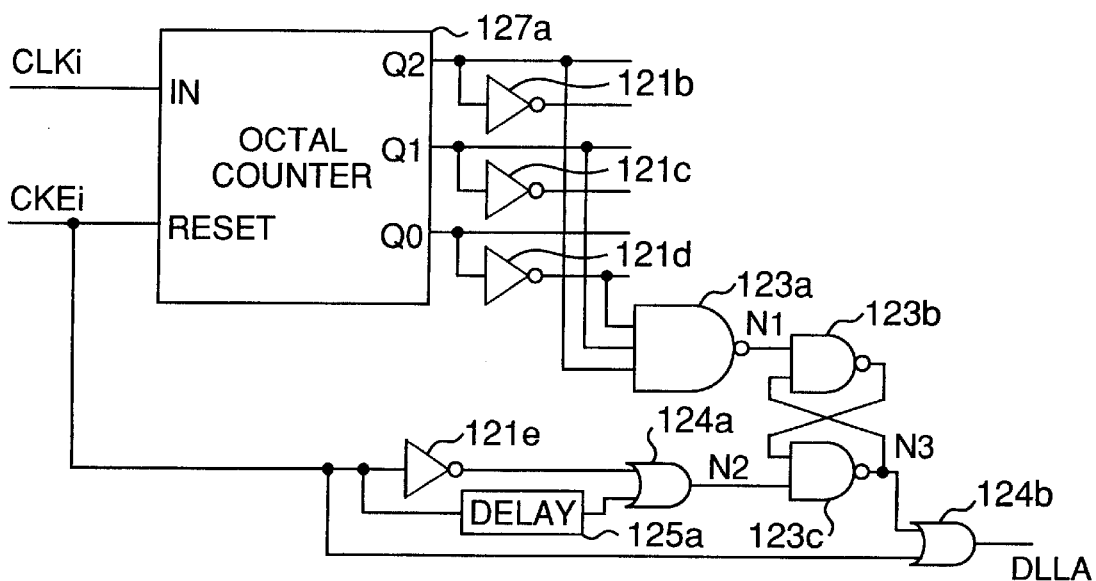
FIG. 19 is a circuit diagram showing a DLL control circuit of the fourth embodiment of the present invention.

FIG. 19 shows the DLL control circuit 12 of the fourth embodiment of the present invention. What FIG. 19 is different from FIG. 15 is in that the inverter 121a, the AND circuit 122a and the ring oscillator 126a are not provided and an input of the octal counter 127a is changed from an output signal N2 of the ring oscillator 126a to the internal clock signal CLKi.

Next, an operation of the fourth embodiment of the present invention will be described below.

Figure 20:
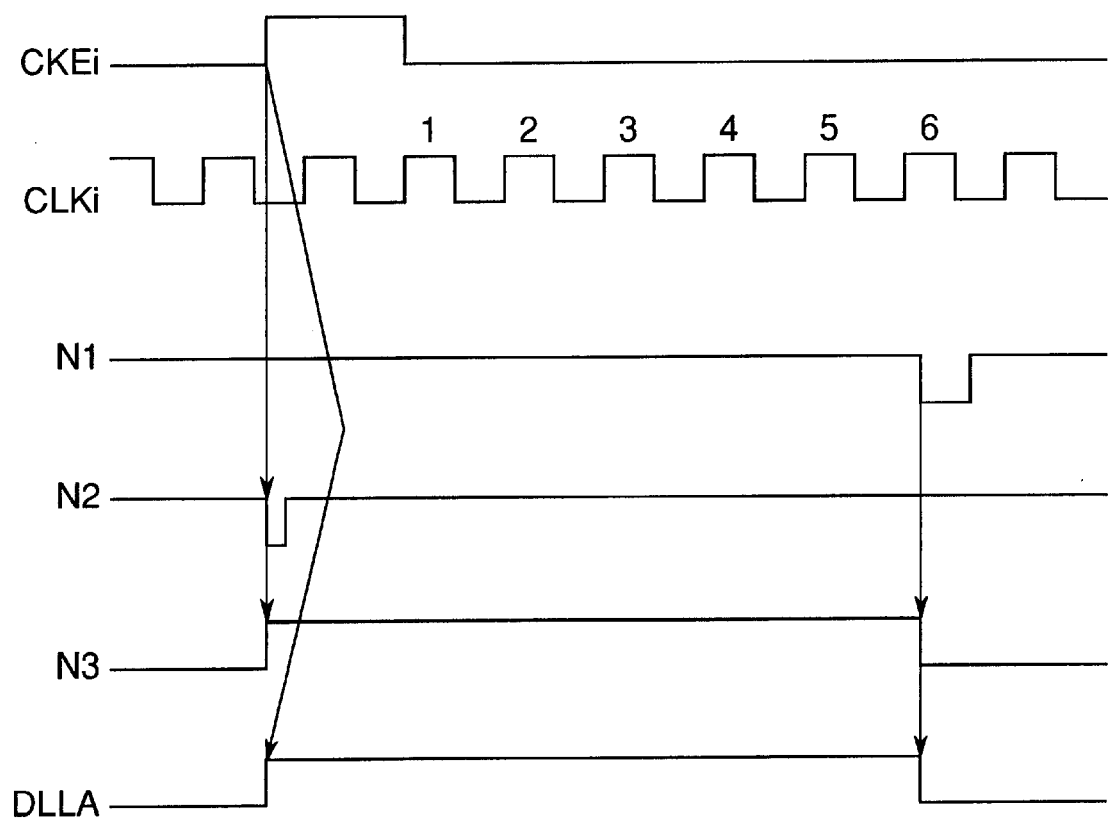
FIG. 20 is a diagram showing an operational timing of a DLL control circuit of the fourth embodiment of the present invention.

FIG. 20 shows a timing diagram of main signals. Although an approximately same operation with that of the third embodiment is indicated, what is different is in that the internal clock signal CLKi always generates a pulse signal.

However, since the start of a count operation of the octal counter 127a is at the time when the level of an internal enable signal CKEi to be a reset signal is changed from H level to L level, the octal counter 127a is operated after reset, similar to the third embodiment of the present invention.

As described above, although in the third embodiment of the present invention of FIG. 15, a pulse signal, which is counted by the octal counter 127a, is generated in the ring oscillator 126a existed inside of the DDR SDRAM 1, in the fourth embodiment of the present invention of FIG. 19, the pulse signal is obtained by the internal clock signal CLKi formed by an external clock signal CLK which is an external signal of the DDR SDRAM 1.

In the fourth embodiment of the present invention, since a signal generated by a signal from the external is employed, the DLL control circuit 12 having a smaller area can be realized without requiring a pulse generator such as the ring oscillator 126a and the like.

Moreover, since a signal generated by a signal from the external is employed, the signal can be synchronized with the external signal, the pulse width of a DLL control signal DLLA can be controlled in accordance with the external signal.

Embodiment 5

Figure 21:
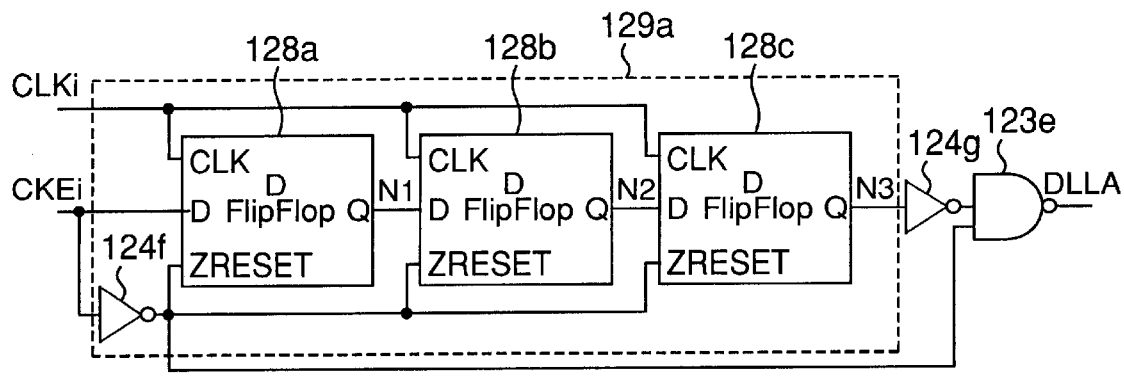
FIG. 21 is a circuit diagram showing a DLL control circuit of the fifth embodiment of the present invention.

FIG. 21 shows the DLL control circuit 12 of the fifth embodiment of the present invention.

In FIG. 21, reference numerals 128a–128c denote a generally called D (Delayed) flip-flop, and when a pulse signal is applied to a pulse input portion CLK of D flip-flop, a signal applied to an input portion D of D flip-flop is outputted to an output portion Q of D flip-flop. Moreover, when a signal of L level is inputted to a reset portion ZRESET, D flip-flop is in a state of reset, and a signal of H level is outputted to the output portion Q.

An internal clock signal CLKi is inputted to a pulse input portion CLK of each D flip-flop, an internal clock enable signal CKEi is inputted to the input portion D of the D flip-flop 128a, and a signal N1 is outputted from the output portion Q. Then, a signal N1 is inputted to the input portion D of the flip-flop 128b, a signal N2 is outputted from the output portion Q, a signal N2 is inputted to the input portion D of the D flip-flop 128c, and a signal N3 is outputted from the output portion Q.

Furthermore, the DLL control circuit 12 of the fifth embodiment of the present invention includes the inverters 124f and 124g and the NAND circuit 123e. Thus, a shift resistor 129a is consisted of the D flip-flop 128a–128c and the inverter 124f.

It should be noted that the entire constitution of the DDR SDRAM 1 of the fifth embodiment of the present invention is identical to that of FIG. 18.

Next, an operation of the fifth embodiment of the present invention will be described below.

Figure 22:
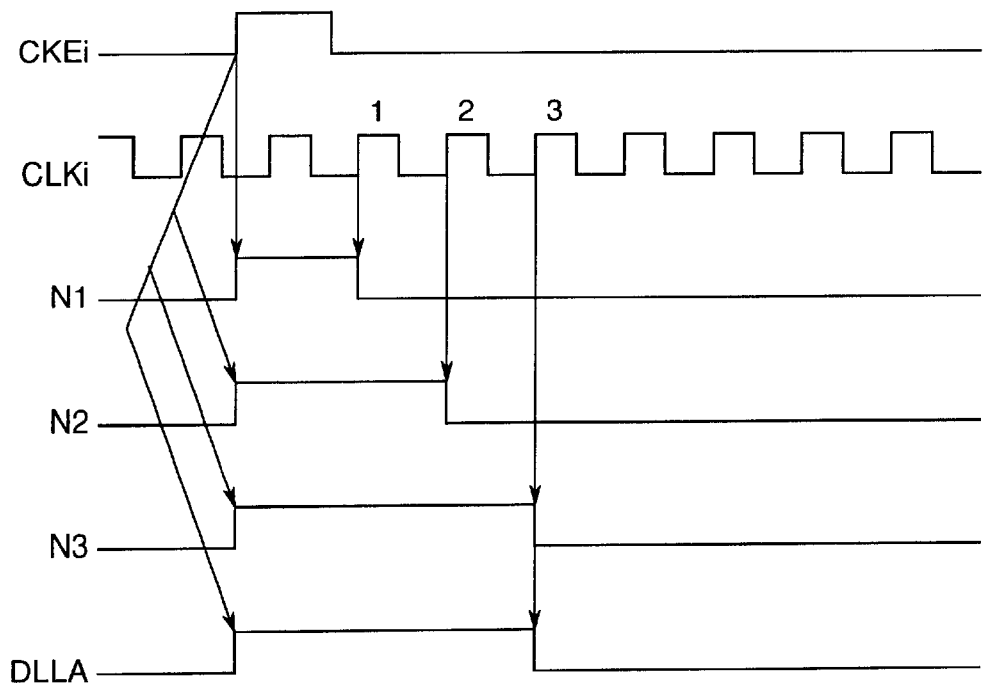
FIG. 22 is a diagram showing an operational timing of a DLL control circuit of the fifth embodiment of the present invention.

FIG. 22 shows a timing diagram of main signals. In FIG. 22, when an internal clock enable signal CKEi is at H level, a signal of L level is inputted via the inverter 124f to a ZRESET portion of each D flip-flop 128a–128c, each D flip-flop 128a–128c is in a state of reset, and the output portion Q is at H level. Since an output signal of the inverter 124f is inputted to the NAND circuit 123e, an output signal of the NAND circuit which is DLL control signal DLLA is at H level.

Next, when an internal clock enable signal CKEi is at L level, each D flip-flop 128a–128c is operated corresponding to the internal clock signal CLKi, first, since the internal clock enable signal CKEi is inputted to the input portion D of the D flip-flop 128a at the first pulse of the internal clock signal CLKi after L level, an output signal N1 is at L level. It should be noted that an output signals N2 and N3 remains at H level.

Subsequently, since at the second pulse of the internal clock signal CLKi, a signal of L level is inputted to the input portion D of the D flip-flops circuits 128a and 128b, the output signals N1 and N2 are at L level. It should be noted that the output signal N3 remains at H level.

Subsequently, since at the third pulse of the internal clock signal CLKi, a single of L level is inputted to the input portion D of each D flip-flop 128a–128c, the output signals N1–N3 are at L level.

Therefore, since a signal via the inverter 124g and the inverter 124f are at H level, a DLL control signal DLLA, which is an output signal of the NAND circuit 123e, is at L level. Here, although an instance in which a signal of L level moves through three of the D flip-flops 128a–128c is indicated, it will be good that the number of the D flip-flops is appropriately controlled and it will be also good that logic circuit and the like are combined so as to move a signal of H level.

As described above, in the fifth embodiment of the present invention, a shift resistor is employed as a circuit maintaining a DLL control signal DLLA at H level for certain time period.

In an instance employing a counter like the fourth embodiment of the present invention, in the case where a counter counting a large number of pulses is employed, when an output Qi of the counter is varied from a less significant bit to a more significant bit, respectively, since the more significant bit is changed in turn on the basis of the less significant bit, it may occasionally require a time to transmit a signal within the counter.

Compared to this, in the case of a shift resistor shown in FIG. 21, since data moves to the flip-flops from a prior step to the next step, even if the D flip-flop has a plurality of steps, operation can be performed in a high speed.

Moreover, since DLL control signal DLLA is synchronizes with an internal clock signal CLKi generated by a signal from the external, the width of a pulse of a DLL control signal DLLA can be controlled corresponding to the external signal.

Embodiment 6

Figure 23:
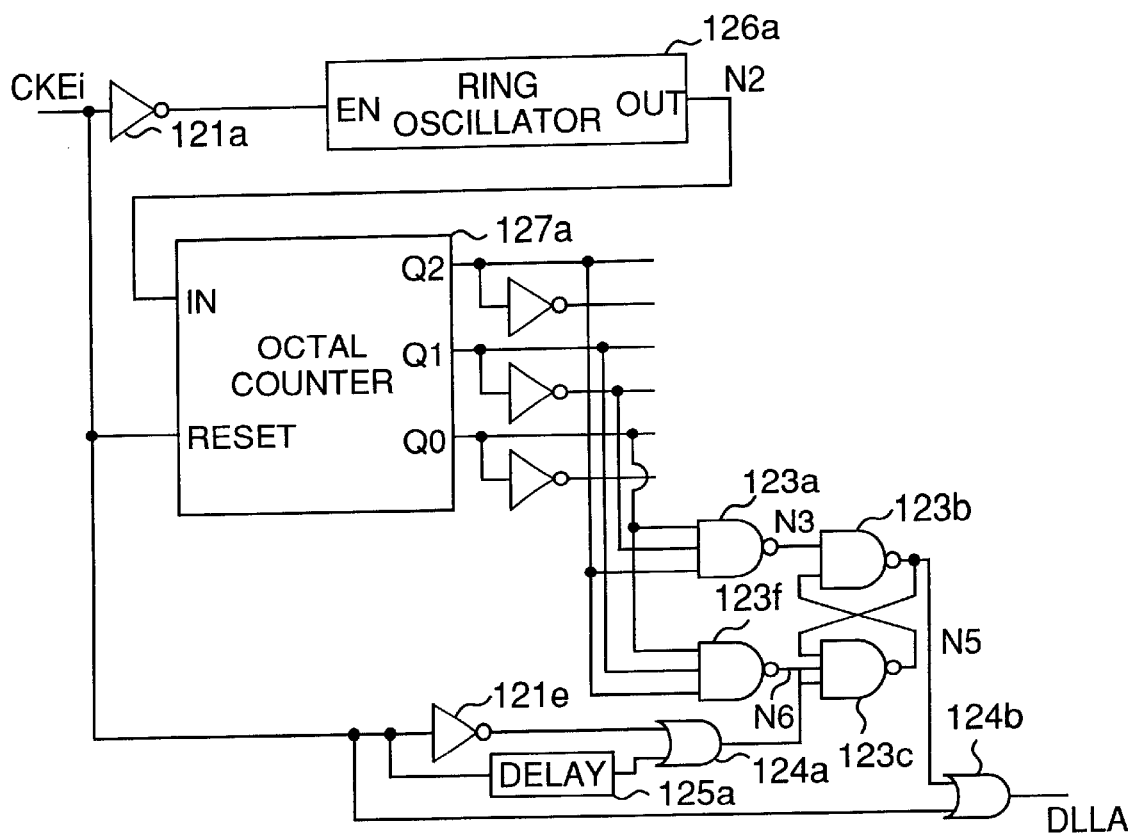
FIG. 23 is a circuit diagram showing a DLL control circuit of the sixth embodiment of the present invention.

FIG. 23 shows the DLL control circuit 12 of the sixth embodiment of the present invention.

In FIG. 23, there are 4 main points, which are different from those of FIG. 15 of the third embodiment of the present invention.

First, the AND circuit 122a of FIG. 15 is absent, and an output of the inverter 121a is directly inputted to the ring oscillator 126a.

Second, the NAND circuit 123f is newly added, its output signal N6 is inputted to the NAND circuit 123c, and the NAND circuit 123c has three input terminals.

Third, an input signal N5 of the OR circuit 124b in FIG. 15 is changed from an output signal of the NAND circuit 123c to an output signal of the NAND circuit 123b.

Fourth, an output signal Q0 of the octal counter 127a, an inverted signal of an output signal Q1, and an output signal Q2 are inputted to the NAND circuit 123a, and output signals Q0–Q2 are inputted to the NAND circuit 123f.

Next, an operation of the sixth embodiment of the present invention will be described below.

Figure 24:
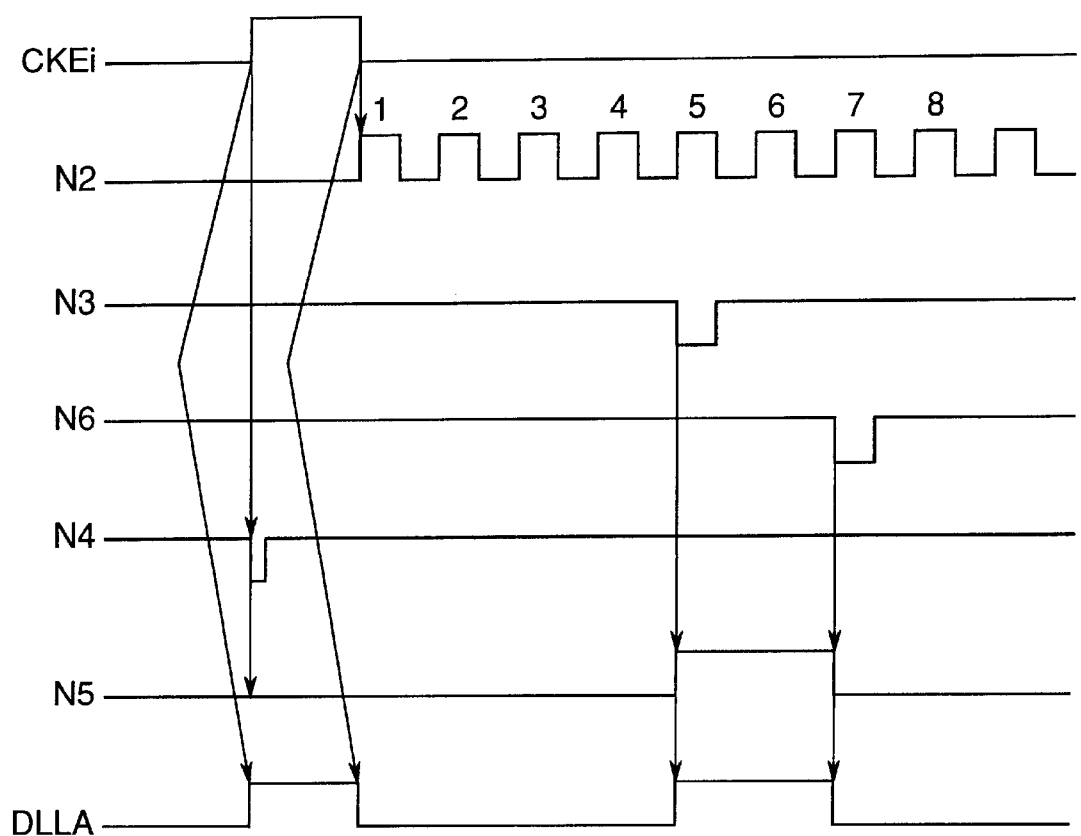
FIG. 24 is a diagram showing an operational timing of a DLL control circuit of the sixth embodiment of the present invention.

FIG. 24 shows a timing diagram of main signals. In FIG. 24, when an internal clock enable signal CKEi is at H level, a DLL control signal DLLA, which is an output signal of the OR circuit 124b, is at H level.

Next, when the internal enable signal CKEi is at L level, a DLL control signal DLLA, which is an output signal of the OR circuit 124b, is at L level.

Consequently, for a time period during which the internal clock enable signal CKEi is at H level, the DLL circuits 3d and 3e are activated.

Moreover, the ring oscillator 126a starts to oscillate corresponding to the change of the level of an internal clock enable signal CKEi from H level to L level, and when the number of pulses is 5, since an output signal Q0 is at H level, an output signal Q1 is at L level, and an output signal Q2 is at H level of the octal counter 127a (not shown), an output signal N3 of the NAND circuit 123a is at L level.

Corresponding to this, an output signal N5 of the NAND circuit 123b is at H level. Furthermore, a DLL control signal DLLA, which is an output signal of the OR circuit 124b, is at H level.

Then, when the number of pulses of the ring oscillator 126a is 7, since output signals Q0–Q2 of the octal counter 127a (not shown) is at H level, and an output signal N6 of the NAND circuit 123f is at L level.

Therefore, a signal, which is an output signal of the NAND circuit 123c and an input signal of the NAND circuit 123b is at H level.

Moreover, since an output signal N3 of the NAND circuit 123a is also at H level, an output signal N5 of the NAND circuit 123b is at L level.

Corresponding to this, a DLL control signal DLLA, which is an output signal of the OR circuit 124b, is also at L level. Consequently, during a time period for which the number of pulses of the ring oscillator 126a is 5–7, a DLL control signal DLLA is at H level.

Next, when the number of pulses of the ring oscillator 126a exceeds over 8, the octal counter 127a returns the count number to 0, and again in turn the number of pulses of the ring oscillator 126a is counted.

Hence, during a time period for which the octal counter counts 5–7 periodically, a DLL control signal DLLA is at H level.

As described above, in the sixth embodiment of the present invention, after the second pulse signal of a DLL control signal DLLA, the start and the end of a pulse signal of the DLL control signal are determined on the basis of a pulse signal generated within the DLL control circuit 12.

Therefore, a DLL control signal DLLA can be easily made a pulse signal having a constant width.

Moreover, since the ring oscillator is serially oscillated and a logic circuit is employed so that a DLL control signal DLLA is made a pulse signal per a certain count number by the combination of output signals of the counter, when an initial trigger is given to the DLL control circuit from the external, then, the DLL circuit can be activated periodically.

It should be noted that although an instance in which a pulse signal is oscillated by the ring oscillator, an instance in which a clock signal generated on the basis of an external clock signal of the fourth and fifth embodiment of the present invention is employed as a pulse signal can be also performed in a similar manner.

Embodiment 7

Figure 25:
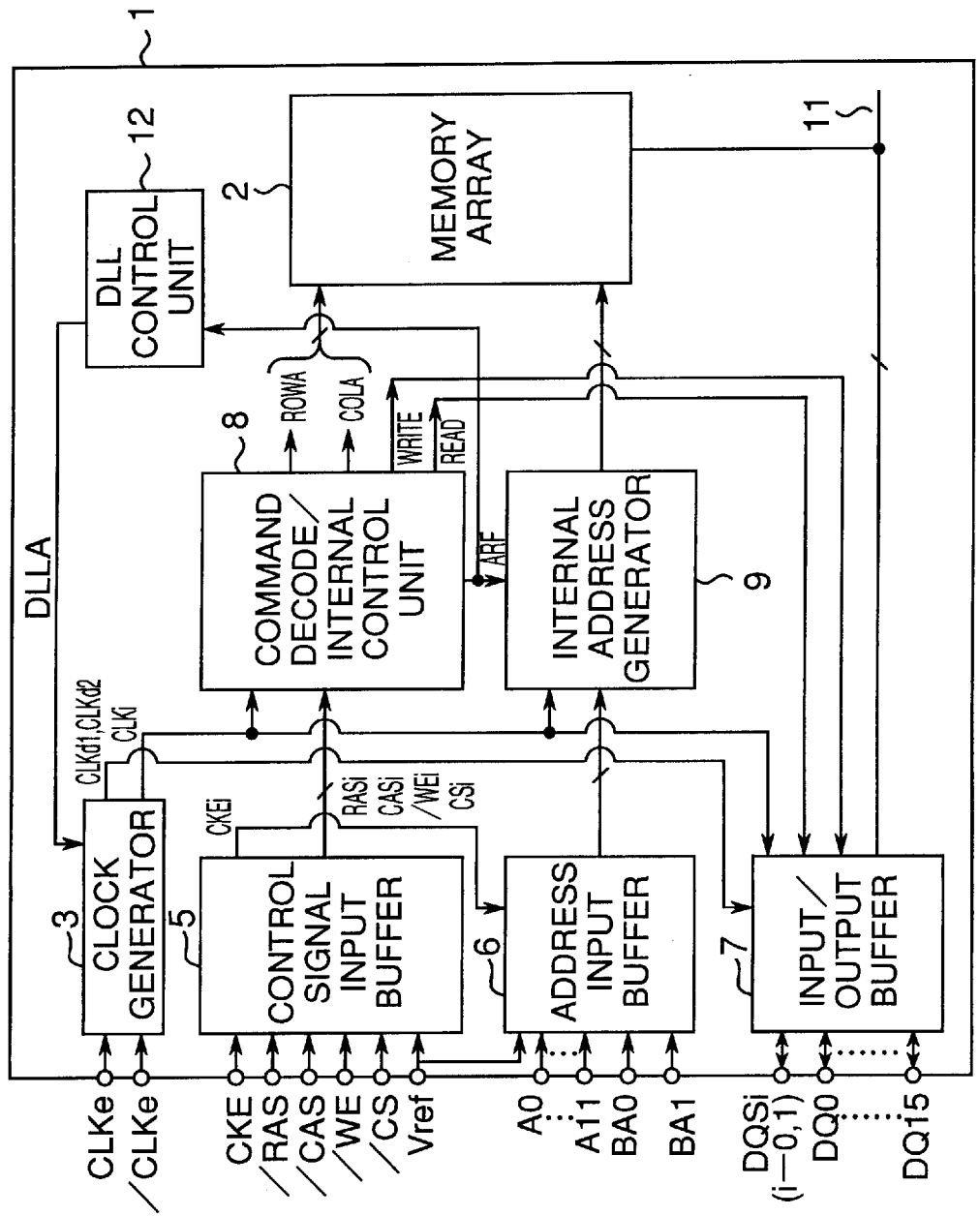
FIG. 25 is a schematic diagram showing the entire DDR SDRAM of the seventh embodiment of the present invention.

FIG. 25 is a schematic diagram showing the entire constitution of 128 M bits DDR SDRAM of the seventh embodiment of the present invention.

FIG. 25 is different from FIG. 1 in that a signal inputted to the DLL control circuit 12 is changed to an auto refresh designation signal ARF which is an output signal of the command decoder/internal controller unit 8, instead of an internal clock enable signal CKEi which is an output signal of the control input signal buffer 5.

Next, an operation of the seventh embodiment of the present invention will be described below.

It should be noted here supposing that the constitution of the DLL control circuit 12 is made similar to that of FIG. 12 of the second embodiment of the present invention, a delay amount of the delay portion 12c of FIG. 12 is 1.5 cycles portion of the external clock signals CLKe and /CLKe, and an inverter and the like are constituted so as to delay the fall of the DLL control signal DLLA.

Figure 26:
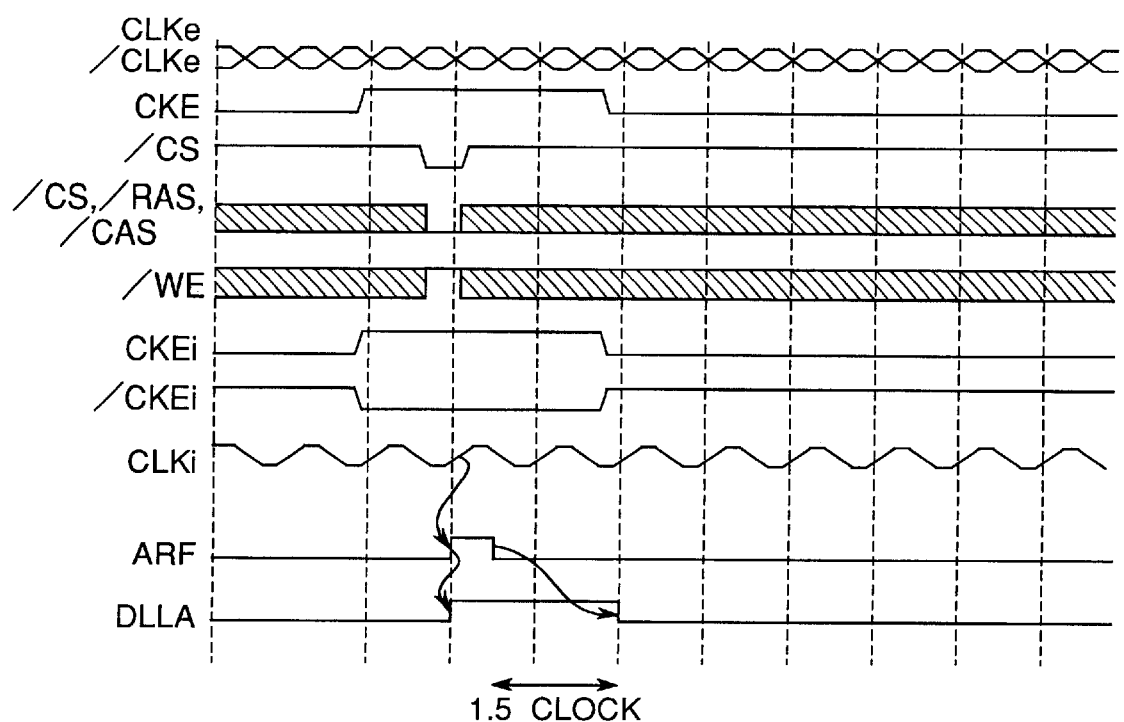
FIG. 26 is a diagram showing an operational timing of a DLL control circuit of the seventh embodiment of the present invention.

FIG. 26 is a diagram showing the main operational timing of the DDR SDRAM of FIG. 25. According to the command decoder/internal controller 8 shown in FIG. 4, external control signals /CS, /RAS, /CAS are at L level, /WE is at H level, and furthermore, when an internal clock signal CLKi is at H level, respectively, an auto refresh designation signal ARF is at H level.

Corresponding to this, a DLL control signal DLLA is at H level during a time period of two cycles of the external clock signals CLKe and /CLKe. As a result of this, DLL input signals DLLi1 and DLLi2, DLL output signals CLKd1 and CLKd2 are varied in level, respectively, similar to those of FIG. 10 (not shown in FIG. 26).

As described above, it will be good that a DLL control signal DLLA is formed using auto refresh designation signal ARF, instead of using a clock enable signal CKE.

A DLL control signal DLLA is formed on the basis of a plurality of control signals, thereby allowing to prevent malfunction due to a single signal of only a clock enable signal CKE.

Concretely, even if a noise or the like gets on an clock enable signal CKE, unless an auto refresh designation signal ARF is at H level, since the DLL circuit is not activated, malfunction due to a noise or the like can be prevented.

Embodiment 8

In the first through seventh embodiments of the present invention, although, in the power down mode, the DLL circuit is inactivated, and the DLL circuit is activated on the basis of a signal in auto refresh, any mode other than the power down mode may be applicable.

For example, since the DLL circuit controls an output data during read operation, when not during read operation, for example, during write operation, unless a jitter of an internal clock is caused due to the external factors, activation of the DLL circuit is not required.

However, as a signal is not necessarily inputted from the external during a specific time period, which is different from the auto refresh mode, it is necessary to periodically generate a control signal for activating the DLL circuit inside of DRAM.

Therefore, it is necessary to employ a circuit for periodically operating the DLL circuit during a period except for a reading operation like the sixth embodiment of the present invention.

In this case, it will be good that for example, a read operation activation signal READ from the command decoder/internal controller 8 is employed, instead of an internal clock enable signal CKEi in FIG. 23. That is to say, any one of activation signals of a read operation will be good.

It will be also good to employ an inverted signal of a write operation activation signal WRITE, which is a direct signal of a write operation, which is similar to an activation signal of a read operation.

As described above, in the eighth embodiment of the present invention, since the DLL circuit is periodically operated in a period except for a read operation, consuming current in a period except for a read operation can be suppressed.

In the above described embodiments of the present invention, although DDR SDRAM is exemplified as a semiconductor device, if any semiconductor device employs the DLL circuit, it can be applied similarly, when a circuit, which is synchronized with an output signal of the DLL circuit and operated, is in a state of inactivation, a delay amount can be controlled and consuming current can be suppressed by activating the DLL circuit during a specific time period.

Moreover, when a circuit, which is synchronized with an output signal of the DLL circuit and operated, is in a state of activation, since a delay amount is appropriately controlled, it can be applied to a high speed operation.

Furthermore, any one of clock generation circuits, not necessarily DLL circuit only, which generates internal clock signal on the basis of an external clock signal can be applied, for example, in the case where it is applied to a PLL (Phase Locked Loop) circuit, consuming current is small, phase error can be suppressed and furthermore, it can be synchronized with a high speed external clock and operated.

Moreover, the first embodiment through the eighth embodiment of the present invention, although in the case where each pulse signal is at H level, it was made approximately in a state of activation, it will be also good that a pulse signal of L level is made in a state of activation by appropriately altering the logic.

For example, it will be also good to activate a DLL control signal DLLA when a DLL control signal DLLA is at L level. In this case, activation time period of the DLL circuit will be made longer by delaying the rise of a DLL control signal DLLA.

As described above, according to the first aspect of the present invention, when a clock synchronization circuit is in a state of inactivation, since it employs a control circuit for activating a clock generation circuit during a specific time period, when the clock synchronization circuit is in a state of inactivation, consuming current in the clock generation circuit can be suppressed except the specific time period.

According to the second aspect of the present invention, since a control signal for activating or inactivating a clock generation circuit is generated on the basis of a signal inputted from the external, activation and inactivation can be determined by the external signal.

According to the third aspect of the present invention, when a clock synchronization circuit is in a state of inactivation, since a control signal for activating a clock generation circuit is generated on the basis of a pulse signal inputted from the external, activation time period can be controlled in the width of a pulse signal.

According to the fourth aspect of the present invention, since the second pulse signal for delaying the rise or fall of the first pulse signal generated on the basis of a pulse signal inputted from the external is made a control signal for activating a clock generation circuit, it can be activated in a longer time period than in that of the width of the pulse signal inputted from the external.

According to the fifth aspect of the present invention, the start of the second pulse signal is based on change of the first pulse signal, the end of the second pulse signal is based on the number of pulses of the third pulse signal generated within the control circuit, the second pulse signal having a certain length can be easily formed.

According to the sixth aspect of the present invention, since the start and end of the second pulse signal are made depending on the number of pulses of the third pulse signal, the second pulse signal having a certain length can be easily formed.

According to the seventh aspect of the present invention, since it is set so that the second pulse signal is periodically generated, a clock generation circuit can be easily activated periodically.

According to the eighth aspect of the present invention, since it has a ring oscillator for generating a pulse signal in a control circuit and a counter for counting the number of pulses, generation of a pulse signal can be easily identified and the number of pulses of a pulse signal can be counted.

According to the ninth aspect of the present invention, when a counter achieves the number of pulses of the first pulse signal, the counter outputs a signal for designating the start of the second pulse signal, when it achieves the number of pulses of the second pulse signal, since it employs a logic circuit which outputs a signal for designating the end of the second pulse signal, the width of the second pulse signal can be determined.

According to the tenth aspect of the first embodiment of the present invention, since the start and end of the second pulse signal is determined by other internal clock signal generated on the basis of an external clock signal, it is not necessary to have a circuit for generating the third pulse signal within a control circuit, and the control circuit having small area can be realized.

According to the eleventh aspect of the present invention, since a control circuit has a counter for counting the number of pulses, the first pulse signal can be easily counted.

According to the twelfth aspect of the present invention, since a control circuit includes a shift resistor controlled by other internal clock signal generated on the basis of an external clock signal, the second pulse signal can be generated by synchronizing the second pulse signal with an external clock signal.

According to the thirteenth and fourteenth aspects of the present invention, since a clock generation circuit includes a DLL (Delay Locked Loop) circuit, when a clock synchronization circuit is in a state of inactivation, a delay amount can be controlled by activation of a specific time period as well as consuming current of the DLL circuit can be suppressed.

According to the fifteenth and the sixteenth aspects of the present invention, since an input signal of a DLL circuit is made a fixed signal when a clock generation circuit is in a state of inactivation, an operation of the DLL circuit can be easily stopped.

According to the seventeenth aspect of the present invention, it is applied to a dynamic random access memory, since a clock synchronization circuit is an output circuit of read data of the dynamic random access memory, it becomes a dynamic random access memory which can perform a stable read operation using low consuming current.

According to the eighteenth aspect of the present invention, since an input signal of a control circuit is based on a clock enable signal for designating an input of an external signal which controls an operation of a dynamic random access memory, a DLL circuit can be activated during a specific time period corresponding to the clock enable signal.

According to the nineteenth aspect of the present invention, since inactivation state of an output circuit of read data is in a power down mode, consuming current can be suppressed in the power down mode.

According to the twentieth aspect of the present invention, since a specific time period for activating a clock generation circuit includes an auto refresh time period of a dynamic random access memory, the clock generation circuit can be activated by synchronizing it with refresh.

According to the twenty-first aspect of the present invention, since an input signal generated on the basis of a signal inputted from the external in a control circuit is an auto refresh designation signal and is generated on the basis of a plurality of external signals, it is strongly built against a noise or the like.

According to the twenty-second aspect of the present invention, since an input signal generated on the basis of a signal inputted from the external in a control circuit is a signal for activating a read operation, consuming current can be suppressed except read operation.

According to the twenty-third aspect of the present invention, since a specific time period for activating a clock generation circuit is made less than one-tenth of a power down mode time period, consuming current can be largely suppressed.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A semiconductor device comprising:
   a clock generation unit generating an internal clock signal based on an external clock signal, said clock generation unit including a delay locked loop circuit;
   a clock synchronization unit adapted to operate in synchronization with the internal clock signal; and
   a control unit adapted to activate the delay locked loop circuit for a specific time period interposed between inactivation periods of the delay locked loop circuit in an inactivation state of the clock synchronization unit.

2. The semiconductor device according to claim 1, wherein an input signal to the control unit is produced based on an external input signal and the control unit generates a control signal for controlling activation or inactivation of the clock generation unit in accordance with the input signal.

3. The semiconductor device according to claim 2, wherein when the clock synchronization unit is in a state of inactivation, the control signal for activating the clock generation unit is generated by the control unit based on the external input signal which is a pulse signal.

4. The semiconductor device according to claim 3, wherein the input signal to the control unit is a first pulse signal which is produced based on the external input pulse signal and the control unit generates a second pulse signal as the control signal for activation of the clock generation unit wherein the second pulse signal has its rise or fall delayed with respect to a rise or fall of the first pulse signal.

5. The semiconductor device according to claim 4, wherein a start of the second pulse signal is based on a change of the first pulse signal and an end of the second pulse signal is based on a fact that a third pulse signal which is generated in the control unit based on the first pulse signal reaches a specified number of pulses.

6. The semiconductor device according to claim 4, wherein a start of the second pulse signal is based on a fact that a third pulse signal which is generated in the control unit based on the first pulse signal reaches a first specified pulse number and an end of the second pulse signal is based on a fact that the third pulse signal reaches a second specified pulse number which is larger than the first specified pulse number.

7. The semiconductor device according to claim 6, wherein when the third pulse signal reaches a third pulse number which is larger than that the second pulse number, the pulse number of the third pulse signal is reset, and the pulse number of the third pulse signal is again increased to reach to the first and second pulse numbers, whereby the second pulse signal is periodically generated.

8. The semiconductor device according to claim 5, wherein the control unit includes a ring oscillator generating the third pulse signal and a counter counting a pulse number of the third pulse signal.

9. The semiconductor device according to claim 6, wherein the control unit includes a ring oscillator generating the third pulse signal, a counter counting a pulse number of the third pulse signal and a logic circuit outputting a designation signal designating a start of the second pulse signal when the counter reaches the first pulse number and outputting a designation signal designating an end of the second pulse signal when reaching the second pulse number.

10. The semiconductor device according to claim 4, wherein the control unit further receives another internal clock signal inputted thereto which is produced based on another external clock signal, and wherein a start of the second pulse signal is based on a change of the first pulse signal and an end of the second pulse signal is based on a fact that the another internal clock signal reaches a specified pulse number.

11. The semiconductor device according to claim 10, wherein the control unit includes a counter counting a pulse number of the another internal clock signal.

12. The semiconductor device according to claim 4, wherein the control unit includes a shift resistor which is controlled by another internal clock signal produced based on an external clock signal, and wherein a start of the second pulse signal is based on a change of the first pulse signal and an end of the second pulse signal is based on the first pulse signal which has passed through the shift resistor.

13. The semiconductor device according to claim 1, wherein the clock generation unit makes an input signal of the delay locked loop circuit a fixed signal before and after the clock generation unit is activated during the specific time period.

14. The semiconductor device according to claim 1, wherein the clock generation unit makes an input signal of the delay locked loop circuit a fixed signal before and after the clock generation unit is activated during the specific time period.

15. The semiconductor device according to claim 14, wherein the semiconductor device includes a dynamic random access memory, and the clock synchronization unit includes an output circuit of read data of the dynamic random access memory.

16. The semiconductor device according to claim 15, wherein the input signal of the control unit produced based on the external input signal is a clock enable signal for designating an input of an external signal for controlling an operation of the dynamic random access memory.

17. The semiconductor device according to claim 16, wherein an inactivated state of the output circuit of the read data is a power down mode of the dynamic random access memory.

18. The semiconductor device according to claim 17, wherein the specific time period for activating the clock generation unit includes an auto refresh time period of the dynamic random access memory.

19. The semiconductor device according to claim 15, wherein the input signal of the control unit produced based on the external input signal is an auto refresh designation signal.

20. The semiconductor device according to claim 15, wherein the input signal of the control unit produced based on the external input signal is a signal for activating a read operation.

21. The semiconductor device according to claim 16, wherein the specific time period for activating the clock generation unit is made less than one-tenth of a time period of a power down mode.

* * * * *